(12) United States Patent
Kempitiya

(10) Patent No.: US 10,680,601 B1
(45) Date of Patent: Jun. 9, 2020

(54) DRIVER FOR SWITCHING INSULATED-GATE BIPOLAR TRANSISTORS WITH FIRST PULL-DOWN SIGNAL AND SECOND PULL-DOWN SIGNAL

(71) Applicant: Infineon Technologies AG, Neubiberg (DE)

(72) Inventor: Asantha Kempitiya, Cerritos, CA (US)

(73) Assignee: Infineon Technologies AG, Neubiberg (DE)

(*) Notice: Subject to any disclaimer, the term of this patent is extended or adjusted under 35 U.S.C. 154(b) by 0 days.

(21) Appl. No.: 16/258,139

(22) Filed: Jan. 25, 2019

(51) Int. Cl.
*H03K 3/00* (2006.01)
*H03K 17/08* (2006.01)
*H03K 17/16* (2006.01)
*H03K 17/687* (2006.01)
*H03K 17/081* (2006.01)
*H03K 5/13* (2014.01)
*H03K 5/00* (2006.01)

(52) U.S. Cl.
CPC ........... *H03K 17/168* (2013.01); *H03K 5/13* (2013.01); *H03K 17/08116* (2013.01); *H03K 2005/00019* (2013.01); *H03K 2005/00078* (2013.01); *H03K 2017/0806* (2013.01); *H03K 2217/0027* (2013.01)

(58) Field of Classification Search
CPC .. H03K 17/168; H03K 5/13; H03K 17/08116; H03K 2017/0806; H03K 2005/00019; H03K 2217/0027
See application file for complete search history.

(56) References Cited

U.S. PATENT DOCUMENTS

| | | | | |
|---|---|---|---|---|
| 5,977,814 A * | 11/1999 | Ishii | ..................... | H03K 17/168 327/108 |
| 7,746,158 B2 * | 6/2010 | Morishita | ............... | H02M 1/08 327/434 |
| 8,350,601 B2 * | 1/2013 | Nagata | ................. | H03K 17/168 327/108 |
| 8,497,728 B2 * | 7/2013 | Mizobe | ................... | H02P 29/02 326/83 |
| 8,829,951 B2 * | 9/2014 | Hosono | ............... | H03K 17/162 327/109 |
| 8,884,660 B2 * | 11/2014 | Fukuta | ................... | H03K 17/00 327/109 |
| 10,305,412 B2 * | 5/2019 | Ojima | ..................... | H02M 1/08 |
| 2014/0218099 A1 * | 8/2014 | Yamada | ............. | H03K 17/0412 327/482 |

* cited by examiner

*Primary Examiner* — Kenneth B Wells
(74) *Attorney, Agent, or Firm* — Shumaker & Sieffert, P.A.

(57) ABSTRACT

A controller circuit for controlling an insulated-gate bipolar transistor (IGBT) is configured to, in response to an IGBT turn off switching event, switch out a first switching element to prevent a pull-up signal from flowing to a gate of the IGBT, switch in a second switching element to create a channel to permit a first pull-down signal to flow to the gate of the IGBT, and switch in a third switching element to create a channel to permit a second pull-down signal to flow to the gate of the IGBT. In response to determining a collector to emitter voltage at the IGBT does not satisfy a threshold, the controller circuit is configured to switch out the third switching element to prevent the second pull-down signal from flowing to the gate of the IGBT.

16 Claims, 19 Drawing Sheets

DRIVER FOR SWITCHING INSULATED-GATE BIPOLAR TRANSISTORS WITH FIRST PULL-DOWN SIGNAL AND SECOND PULL-DOWN SIGNAL

TECHNICAL FIELD

This disclosure relates to circuitry for driving insulated-gate bipolar transistors (IGBTs), particularly, IGBTs in hard-switched applications.

BACKGROUND

Insulated-gate bipolar transistors (IGBTs) have desirable characteristics, which can make them more suitable compared to metal-oxide-semiconductor field-effect transistors (MOSFETs), especially for high power and high efficiency applications. For example, IGBTs may be used in many applications, such as, but not limited to, variable-frequency drives (VFDs), automotive, power converters, light emitted diodes (LEDs), and other applications. As a byproduct of switching operation, an IGBT may produce waste heat. If an IGBT reaches a temperature exceeding a temperature rating for the IGBT, the IGBT may deteriorate or permanently fail.

SUMMARY

In general, this disclosure is directed to a driver for an insulated-gate bipolar transistor (IGBT) with a first pull-down signal to reduce switching loss at the IGBT and a second pull-down signal to reduce switching loss at the IGBT and to reduce voltage overshoot at the IGBT. For example, the driver may be configured to, in response to a turn off a switching event, permit a first pull-down signal and a second pull-down signal to quickly reduce a current flowing through the IGBT and then permit only the first pull-down signal to reduce a peak turn off voltage at the IGBT. In this way, the driver may "decouple" a rate of change of current (di/dt) and a rate of change of voltage (dv/dt) performance of the IGBT, which may reduce a switching loss at the IGBT while helping to ensure that the peak turn off voltage at the IGBT is less than a voltage rating at the IGBT. Reducing the switching loss at the IGBT may reduce an amount of waste heat produced by the IGBT, which may help to protect the IGBT from damaging heat and help to improve a reliability of the IGBT.

In an example, a controller circuit for controlling an IGBT is configured to: switch out a first switching element to prevent a pull-up signal from flowing to a gate of the IGBT in response to an IGBT turn off switching event; switch in a second switching element to create a channel to permit a first pull-down signal to flow to the gate of the IGBT in response to the IGBT turn off switching event; switch in a third switching element to create a channel to permit a second pull-down signal to flow to the gate of the IGBT in response to the IGBT turn off switching event; and in response to determining a collector to emitter voltage at the IGBT does not satisfy a threshold, switch out the third switching element to prevent the second pull-down signal from flowing to the gate of the IGBT.

In another example, a method controlling an IGBT includes: switching out, by a controller circuit, a first switching element to prevent a pull-up signal from flowing to a gate of the IGBT in response to an IGBT turn off switching event; switching in, by the controller circuit, a second switching element to create a channel to permit a first pull-down signal to flow to the gate of the IGBT in response to the IGBT turn off switching event; switching in, by the controller circuit, a third switching element to create a channel to permit a second pull-down signal to flow to the gate of the IGBT in response to the IGBT turn off switching event; and in response to determining a collector to emitter voltage at the IGBT does not satisfy a threshold, switching out, by the controller circuit, the third switching element to prevent the second pull-down signal from flowing to the gate of the IGBT.

In another example, an IGBT system includes: an IGBT; and a controller circuit configured to: switch out a first switching element to prevent a pull-up signal from flowing to a gate of the IGBT in response to an IGBT turn off switching event; switch in a second switching element to create a channel to permit a first pull-down signal to flow to the gate of the IGBT in response to the IGBT turn off switching event; switch in a third switching element to create a channel to permit a second pull-down signal to flow to the gate of the IGBT in response to the IGBT turn off switching event; and in response to determining a collector to emitter voltage at the IGBT does not satisfy a threshold, switch out the third switching element to prevent the second pull-down signal from flowing to the gate of the IGBT.

Details of these and other examples are set forth in the accompanying drawings and the description below. Other features, objects, and advantages will be apparent from the description and drawings, and from the claims.

DETAILED DESCRIPTION

In hard-switched insulated-gate bipolar transistor (IGBT) applications, some voltage gate drive techniques, use a single turn on and/or off gate resistance to control the IGBT's switching speed. In order to reduce IGBT turn off switching loss, such systems may use a reduced turn off gate resistance. Because both IGBT turn off di/dt and dv/dt are coupled, this may result in an increase in both di/dt and dv/dt responses of the IGBT during turn off. As such, reducing turn off gate resistance may increase turn off di/dt and may also result in a corresponding increase in the IGBT turn off overshoot voltage due to a relationship between IGBT turn off overshoot voltage and turn off di/dt of approximately $L_{stray}*di/dt$ (where $L_{stray}$ is the loop stray inductance). Because each IGBT may be designed to operate reliably up to a specific rated voltage (e.g., 650V), this increase in overshoot voltage can have effects on the instantaneous and long-term reliability of the IGBT.

Some drivers are based on applying a lowest possible turn off gate resistance which limits the maximum turn off di/dt and consequently maintains the IGBT's turn off overshoot voltage below the IGBT's rated breakdown voltage. In such drivers, if not for the IGBT's maximum rated breakdown voltage limitation, the IGBT can be driven faster to obtain lower turn off switching loss. Thus, one disadvantage of such drivers is a limit to how much the IGBT turn off switching loss can be reduced is limited by the IGBT's rated breakdown voltage.

In accordance with one or more techniques described herein, a driver may be configured to "decouple" the IGBT's turn off di/dt and dv/dt such that the IGBT turn off switching loss can be further reduced compared to drivers limited by the IGBT's rated breakdown voltage. In this way, the driver may operate an IGBT to turn off under optimum dv/dt and di/dt (hence lower overshoot voltage) to help to achieve a maximum possible reduction in IGBT turn off switching loss. For example, a driver may be configured to permit a first pull-down signal to flow to a gate of the IGBT to reduce switching loss at the IGBT and permit a second pull-down signal to flow to the gate of the IGBT to reduce voltage overshoot at the IGBT. Accordingly, such drivers may reduce a switching loss at the IGBT while helping to ensure that the peak turn off voltage at the IGBT is less than a voltage rating at the IGBT, which may reduce an amount of waste heat produced by the IGBT to help to protect the IGBT from damaging heat and to improve a long-term reliability of the IGBT.

Figure 1:
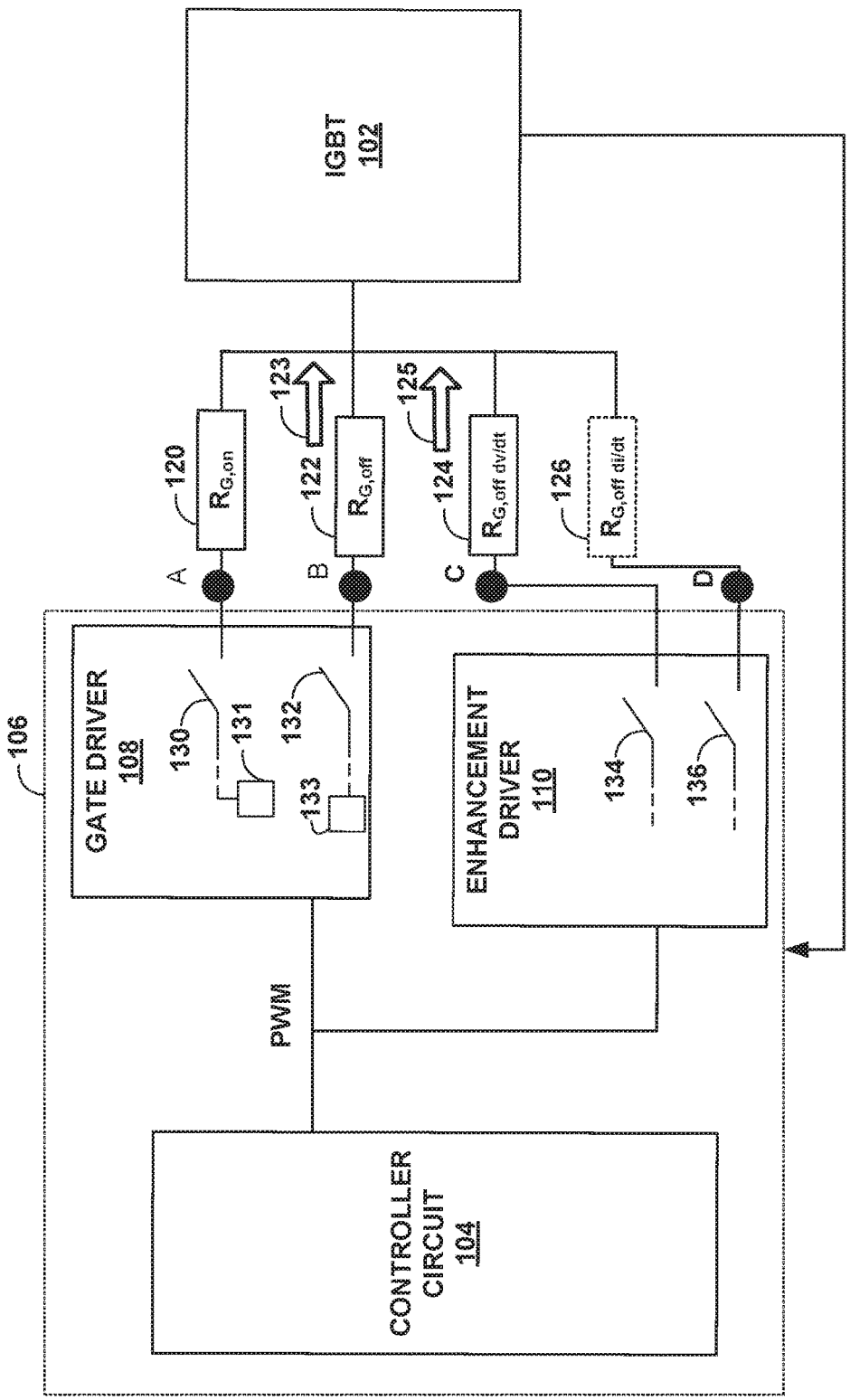
FIG. 1 is a block diagram illustrating driver circuitry for an insulated-gate bipolar transistor (IGBT) with a first pull-down signal and a second pull-down signal in accordance with one or more techniques of this disclosure.

FIG. 1 is a block diagram illustrating a system 100 for an IGBT 102 with a first pull-down signal 123 and a second pull-down signal 125 in accordance with one or more techniques of this disclosure. FIG. 1 shows system 100 which includes driver circuitry 106, gate turn-on resistor 120, gate turn-off resistor 122, gate turn-off resistor 124, and IGBT 102. Driver circuitry 106 may include a controller circuit 104, gate driver 108, and enhancement driver 110. System 100 may include additional components. For example, system 100 may include gate turn-off resistor 126. In some examples, one or more components of system 100 may be omitted. For example, gate turn-off resistor 124 may be omitted and enhancement driver 110 may be coupled to gate turn-off resistor 122. In some examples, driver circuit 106 may be implemented as a single or multiple integrated circuit (IC) packages.

IGBT 102 may refer to a device comprising alternating P—N—P—N layers that is controlled by a metal-oxide-semiconductor (MOS) gate structure. In some examples, IGBT 102 may include a collector, a emitter, and a gate. In this example, current at the gate may control a conductive path between the collector and the emitter.

Gate driver 108 may include a first switching element 130 configured to permit a pull-up signal to flow, via gate turn-on resistor 120, to a gate of IGBT 102. As shown, gate driver 108 may include a second switching element 132 configured to permit first pull-down signal 123 to flow, via gate turn-off resistor 122, to the gate of IGBT 102. Examples of switching elements may include, but are not limited to, junction field-effect transistor (JFET), metal-oxide-semiconductor Field-Effect-Transistor (MOSFET), dual-gate MOSFET, insulated-gate bipolar transistor (IGBT), any other type of FET, or any combination of the switching elements. Examples of MOSFETS may include, but are not limited to, p-channel MOSFET (pMOS), n-channel MOSFET (nMOS), double diffused MOSFET (DMOS), or any other type of MOSFET, or any combination of the same. In some examples, a switching element may comprise a high-electron mobility transistor, a GaN based transistor, or another switching element. Other materials may also be used to realize a switching element.

More specifically, for example, gate driver 108 may be configured to switch in switching element 132 to create the channel such that first pull-down signal 123 flows through gate turn-on resistor 122 to a gate of IGBT 102. Similarly, gate driver 108 may be configured to switch out switching element 132 to prevent the first pull-down signal from flowing to gate turn-on resistor 122 coupled to the gate of the IGBT 102. Gate driver 108 may be configured to switch out switching element 130 to prevent the pull-up signal from flowing to gate turn-on resistor 120 coupled to the gate of the IGBT 102. Similarly, gate driver 108 may be configured to switch in switching element 130 to create the channel such that the pull-up signal flows through gate turn-on resistor 120 to a gate of IGBT 102.

Enhancement driver 110 may include a third switching element 134 configured to permit second pull-down signal 125 to flow, via gate turn-off resistor 124, to the gate of IGBT 102. In some examples, third switching element 134 is configured to permit the second pull-down signal to flow, via gate turn-off resistor 122, to the gate of IGBT 102. In some examples, enhancement driver 110 may include a fourth switching element 136 configured to permit a fourth pull-down signal to flow, via gate turn-off resistor 126, to the gate of IGBT 102. In some examples, fourth switching element 136 is configured to permit a fourth pull-down signal to flow, via gate turn-off resistor 122, to the gate of IGBT 102. In some examples, fourth switching element 136 may be omitted.

Enhancement driver 110 may be configured to switch in switching element 134 to create the channel such that a second pull-down signal flows through gate turn-off resistor 124 to a gate of IGBT 102. Similarly, enhancement driver 110 may be configured to switch out switching element 134 to prevent the second pull-down signal from flowing to gate turn-off resistor 124 coupled to the gate of the IGBT 102. Enhancement driver 110 may be configured to switch out switching element 136 to prevent a pull-down signal from flowing to gate turn-off resistor 126 coupled to the gate of the IGBT 102. Similarly, enhancement driver 110 may be configured to switch in switching element 136 to create the channel such that the pull-down signal flows through gate turn-off resistor 126 to a gate of IGBT 102. In the example of FIG. 1, switching element 134 is coupled to gate turn-off resistor 124. However, in other examples, switching element 134 may be coupled to gate turn-off resistor 122 and gate turn-off resistor 124 may be omitted.

Gate driver 108 may be configured to switch in switching element 132 such that the channel created by second switching element 132 permits a first pull-down current to flow from the gate of IGBT 102 to a pull-down source. Similarly, enhancement driver 110 may be configured to switch in third switching element 134 such that the channel created by switching element 134 permits a second pull-down current to flow from the gate of IGBT 102 to the pull-down source.

Supply 131 may be configured to provide a pull-up signal. For instance, supply 131 may be configured to supply a charge at a gate of IGBT 102. In some examples, supply 131 may be an output of a power converter, power inverter, regulator, or other power conversion circuitry. For instance, supply 131 may be an output of a direct current (DC) to DC power converter, an alternating current (AC) to DC power converter, a DC to AC power inverter, a linear regulator, or other power conversion circuitry.

Supply 133 may be configured to provide a pull-down signal. For instance, supply 133 may be configured to discharge a gate of IGBT 102. In some examples, supply 133 may be an output of a power converter, power inverter, regulator, or other power conversion circuitry. Although not shown, one or more of third switching element 134 and fourth switching element 136 may have a respective supply similar to supply 133. In some examples, supply 133 may output a voltage having an opposite polarity from a voltage output by supply 131. For instance, supply 131 may output a positive voltage and supply 133 may output a negative voltage.

Controller circuit 104 may be configured to control a switching of one or more of first switching element 130, second switching element 132, third switching element 134, or fourth switching element 136. In some examples, controller circuit 104 may receive a pulse width modulation (PWM) signal and determine an IGBT turn off switching event using the PWM signal. In some examples, controller circuit 104 may be configured to control a switching of one or more of first switching element 130, second switching element 132, third switching element 134, or fourth switching element 136 using an indication of a voltage at IGBT 102 and/or an indication of a current at IGBT 102. Controller circuit 104 may comprise any suitable arrangement of hardware, software, firmware, or any combination thereof. Controller circuit 104 may include any one or more microprocessors, digital signal processors (DSPs), application specific integrated circuits (ASICs), field programmable gate arrays (FPGAs), or any other equivalent integrated or discrete logic circuitry, as well as any combinations of such components. When controller circuit includes software or firmware, controller circuit may further include any necessary hardware for storing and executing the software or firmware, such as one or more memories and one or more processors or processing units. In general, controller circuit may include one or more microprocessors, DSPs, ASICs, FPGAs, or any other equivalent integrated or discrete logic circuitry, as well as any combinations of such components.

In operation, controller circuit 104 may be configured to switch out first switching element 130 to prevent a pull-up signal from flowing to a gate of IGBT 102 in response to an IGBT turn off switching event, switch in second switching element 132 to create a channel to permit a first pull-down signal to flow to the gate of IGBT 102 in response to the IGBT turn off switching event, and switch in third switching element 134 to create a channel to permit a second pull-down signal to flow to the gate of IGBT 102 in response to the IGBT turn off switching event. In response to determining a collector to emitter voltage at IGBT 102 does not satisfy a threshold, the controller circuit may be configured to switch out third switching element 134 to prevent the second pull-down signal from flowing to the gate of IGBT 102.

Figure 2A:
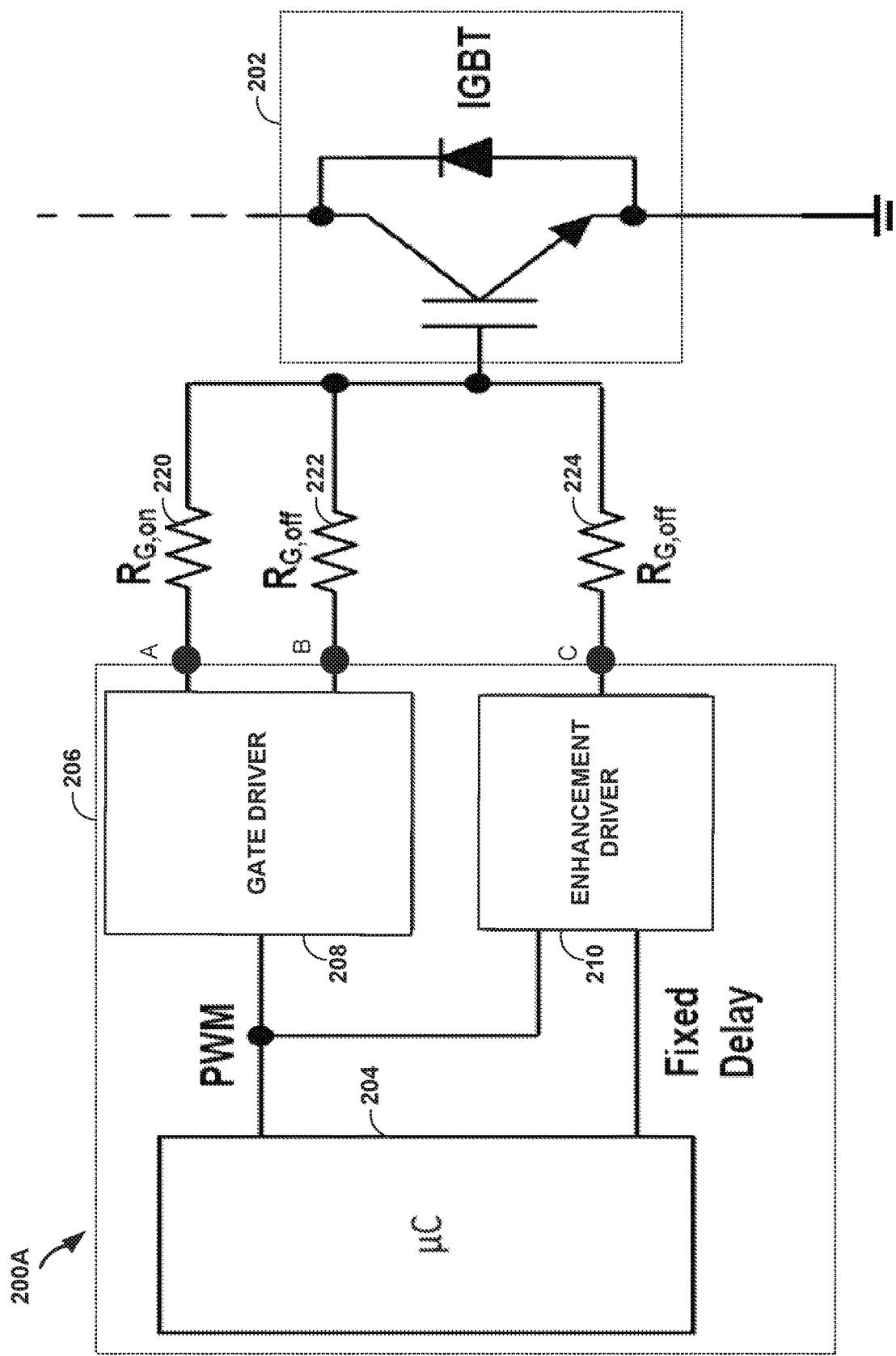
FIG. 2A is a circuit diagram illustrating a first example of the driver circuitry of FIG. 1 with a fixed delay in accordance with one or more techniques of this disclosure.

FIG. 2A is a circuit diagram illustrating a first example of driver circuitry 106 of FIG. 1 with a fixed delay in accordance with one or more techniques of this disclosure. As shown, system 200A includes driver circuitry 206, gate turn-on resistor 220, gate turn-off resistor 222, gate turn-off resistor 224, and IGBT 202, which may be examples of driver circuitry 106, gate turn-on resistor 120, gate turn-off resistor 122, gate turn-off resistor 124, and IGBT 102 of FIG. 1, respectively. Driver circuitry 206 may include microcontroller 204, gate driver 208, and enhancement driver 210, which may be examples of controller circuit 104, gate driver 108, and enhancement driver 110 of FIG. 1, respectively. Driver circuitry 206 may be implemented as a single or multiple IC packages. In this example, enhancement driver 210 outputs a second pull-down signal, also referred to herein as "dv/dt enhancement signal" or simply "enhancement pull-down signal", via gate turn-off resistor 224, to a gate of IGBT 202.

Figure 2B:
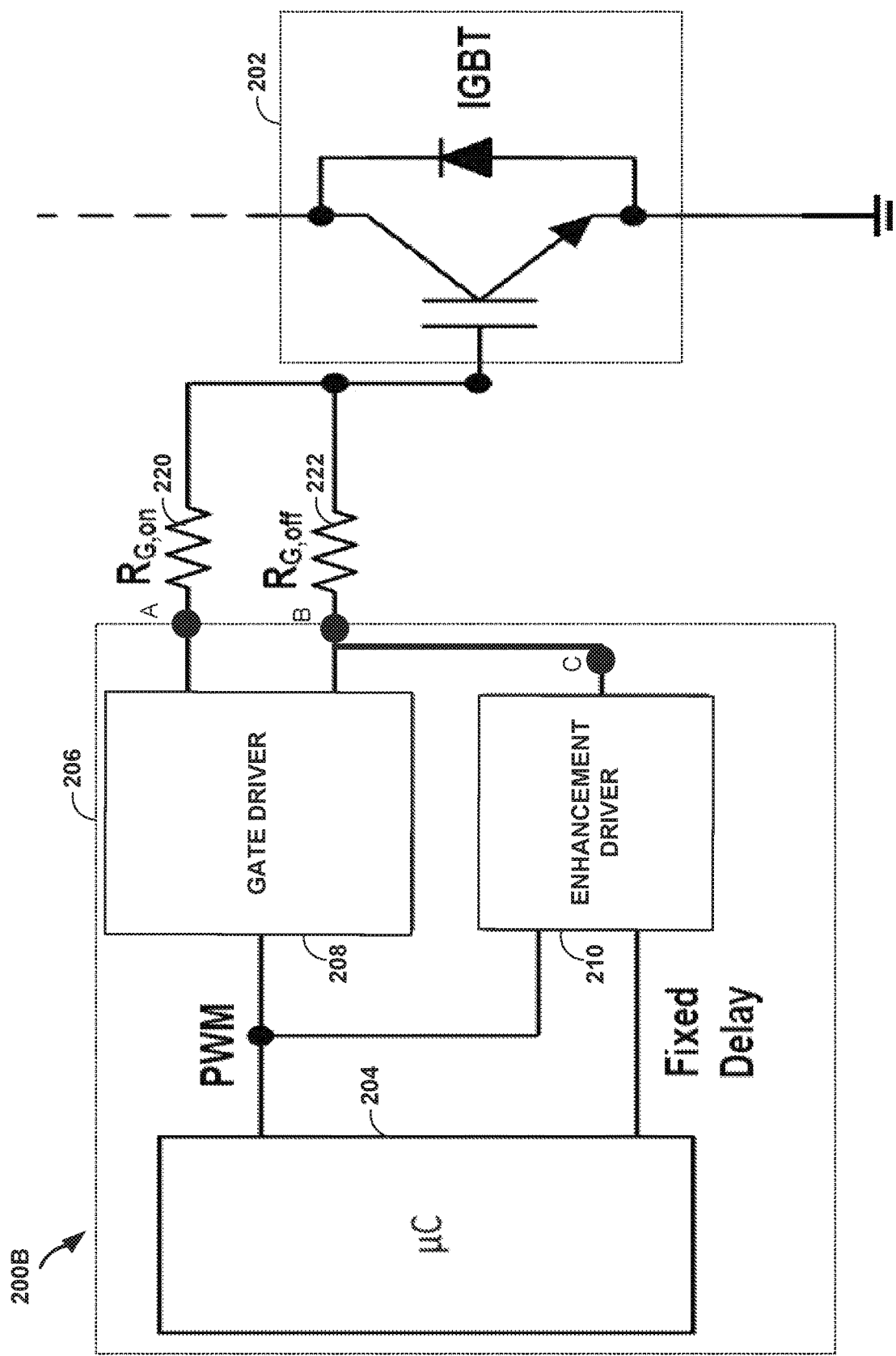
FIG. 2B is a circuit diagram illustrating a second example of the driver circuitry of FIG. 1 with a fixed delay in accordance with one or more techniques of this disclosure.

FIG. 2B is a circuit diagram illustrating a second example of the driver circuitry 106 of FIG. 1 with a fixed delay in accordance with one or more techniques of this disclosure. Similar to system 200A, system 200B includes driver circuitry 206, gate turn-on resistor 220, gate turn-off resistor 222, and IGBT 202, which may be examples of driver circuitry 106, gate turn-on resistor 120, gate turn-off resistor 122, and IGBT 102 of FIG. 1, respectively. However, system 200B omits gate turn-off resistor 224. Driver circuitry 206 may include microcontroller 204, gate driver 208, and enhancement driver 210, which may be examples of controller circuit 104, gate driver 108, and enhancement driver 110 of FIG. 1, respectively. Driver circuitry 206 may be implemented as a single or multiple IC packages. In this example, enhancement driver 210 outputs a second pull-down signal, via gate turn-off resistor 222, to a gate of IGBT 202.

In the examples of FIGS. 2A and 2B, microcontroller 204 may define the fixed input delay based on switching characterization of IGBT 202 at the maximum load current and bus voltage specific to an application for IGBT 202. This fixed delay may be externally supplied by microcontroller 204 to generate a dv/dt enhancement signal. In this way, driver circuitry 206 may be provide a reduction in turn off switching losses at high current for a peak turn off overshoot voltage (e.g., 30% at 400V/180 A). The example of FIG. 2A uses only one additional external component (additional turn off gate resistance) compared to systems that omit enhancement driver 210. However, the example of FIG. 2B uses the same external components as systems that omit enhancement driver 210. In some examples, enhancement driver 210 can be realized in an integrated circuit comprising gate driver circuitry 206 to extend the performance of existing gate driver circuitry 206. In the example of FIG. 2A, if realized in a gate driver IC, driver circuitry 206 may use only two additional pins compared to systems that omit enhancement driver 210, with an additional input pin configured for setting a fixed delay and an additional output pin for connecting enhancement driver 210 to gate turn-off resistor 224. However, in the example of FIG. 2B, driver circuitry 206 may use only an additional pin compared to systems that omit enhancement driver 210, where the additional pin is an input pin configured for setting a fixed delay. The examples of FIGS. 2A and 2B, may use no additional sensing circuitry compared to systems that omit enhancement driver 210 and/or can be operated in open loop. The examples of FIGS. 2A and 2B may be used in fixed bus voltage systems.

The external fixed delay may provide maximum performance improvement at maximum system current and lesser improvement at lower currents. However, the external fixed delay may not interfere with normal system operation. Due to reduced switching losses, IGBT 202 may have lower junction temperature during operation and or may have reduced cooling constraints on systems 200A and 200B. Additionally, reducing the switching losses at IGBT 202 may improve the electro-mechanical reliability of the IGBT and/or may accommodate higher conduction losses, this would allow smaller IGBT active area requirement for implementing products with similar current rating compared to systems that omit enhancement driver 210.

Figure 3A:
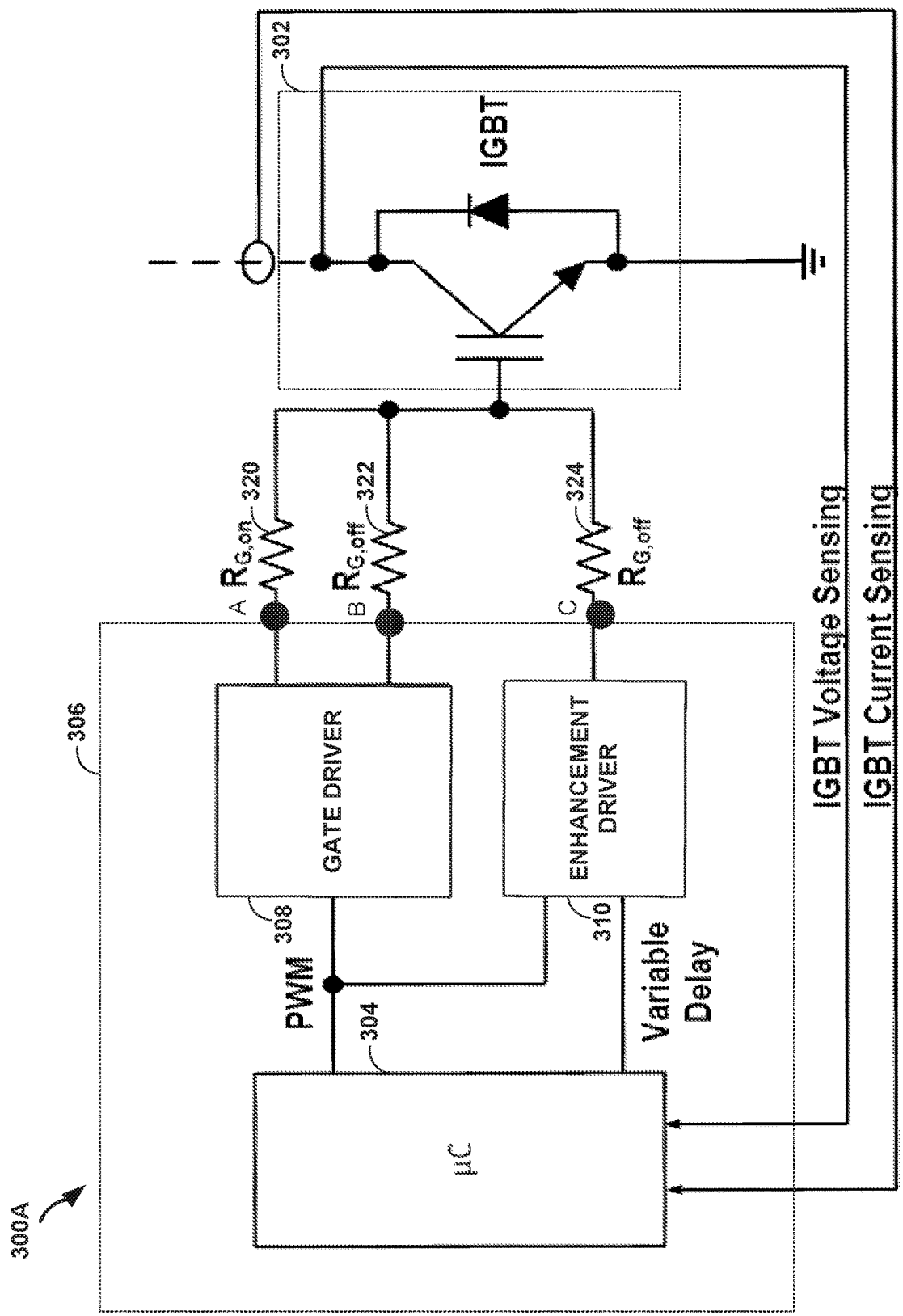
FIG. 3A is a circuit diagram illustrating a first example of the driver circuitry of FIG. 1 with a variable delay determined by a controller in accordance with one or more techniques of this disclosure.

FIG. 3A is a circuit diagram illustrating a first example of driver circuitry 106 of FIG. 1 with a variable delay determined by a controller in accordance with one or more techniques of this disclosure. As shown, system 300A includes driver circuitry 306, gate turn-on resistor 320, gate turn-off resistor 322, gate turn-off resistor 324, and IGBT 302, which may be examples of driver circuitry 106, gate turn-on resistor 120, gate turn-off resistor 122, gate turn-off resistor 124, and IGBT 102 of FIG. 1, respectively. Driver circuitry 306 may include microcontroller 304, gate driver 308, and enhancement driver 310, which may be examples of controller circuit 104, gate driver 108, and enhancement driver 110 of FIG. 1, respectively. Driver circuitry 306 may be implemented as a single or multiple IC packages. In this example, enhancement driver 310 outputs a second pull-down signal, also referred to herein as "dv/dt enhancement signal" or simply "pull-down signal", via gate turn-off resistor 324, to a gate of IGBT 302.

In the example of FIG. 3A, microcontroller 304 may be configured to calculate a variable delay to reduce losses at IGBT 302. The example of FIG. 3A may be used in variable bus voltage systems. The example of FIG. 3A may use a bus voltage and current measurement techniques available in system 300A (e.g., inverters and DC-DC converters). Microcontroller 304 may define the input delay based on a switching characterization of IGBT 302 at various load current and bus voltage levels specific to the application of IGBT 302. Based on the voltage and current level, microcontroller 304 of system 300A may provide a variable delay based on a look-up table to enhancement driver 310.

Figure 3B:
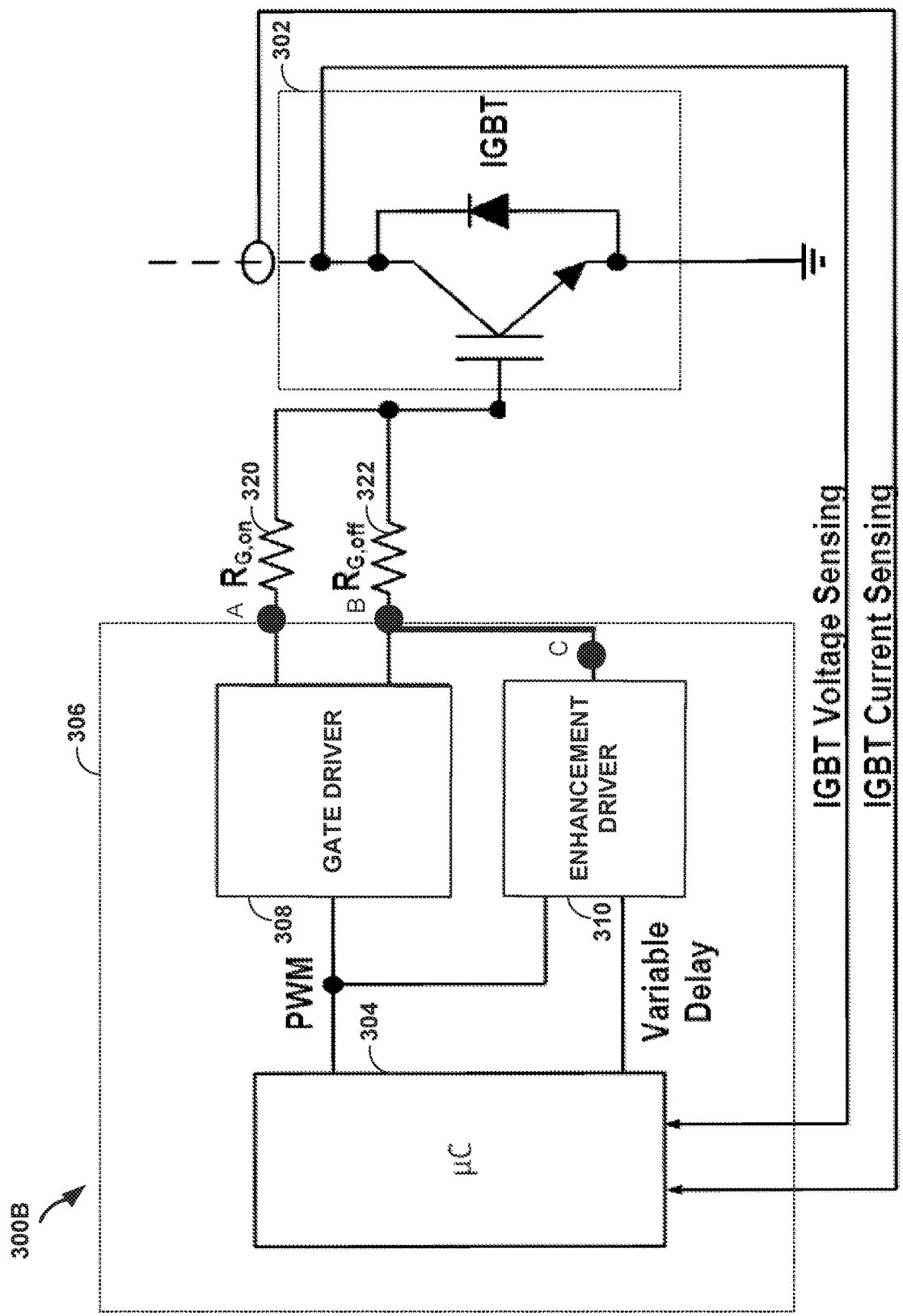
FIG. 3B is a circuit diagram illustrating a second example of the driver circuitry of FIG. 1 with a variable delay determined by a controller in accordance with one or more techniques of this disclosure.

FIG. 3B is a circuit diagram illustrating a second example of driver circuitry 106 of FIG. 1 with a variable delay determined by a controller in accordance with one or more techniques of this disclosure. Similar to system 300A, system 300B includes driver circuitry 306, gate turn-on resistor 320, gate turn-off resistor 322, and IGBT 302, which may be examples of driver circuitry 106, gate turn-on resistor 120, gate turn-off resistor 122, and IGBT 102 of FIG. 1, respectively. However, system 300B omits gate turn-off resistor 324. Driver circuitry 306 may include microcontroller 304, gate driver 308, and enhancement driver 310, which may be examples of controller circuit 104, gate driver 108, and enhancement driver 110 of FIG. 1, respectively. Driver circuitry 306 may be implemented as a single or multiple IC packages. In this example, enhancement driver 310 outputs a second pull-down signal, via gate turn-off resistor 322, to a gate of IGBT 302.

Figure 4A:
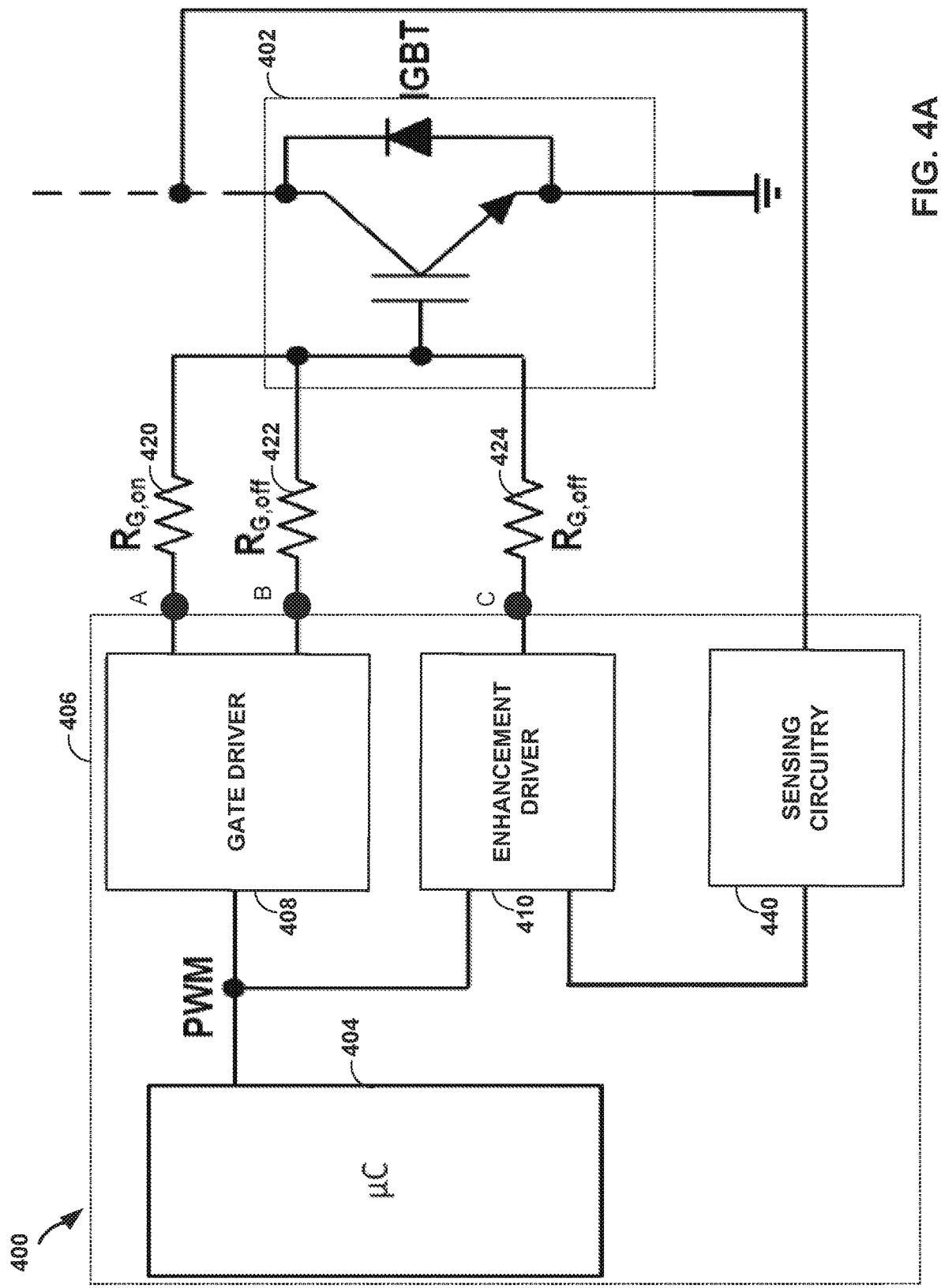
FIG. 4A is a circuit diagram illustrating a first example of the driver circuitry of FIG. 1 with a variable delay determined by a sensing circuit in accordance with one or more techniques of this disclosure.

FIG. 4A is a circuit diagram illustrating a first example of driver circuitry 106 of FIG. 1 with a variable delay determined by a sensing circuitry 440 in accordance with one or more techniques of this disclosure. As shown, system 400A includes driver circuitry 406, gate turn-on resistor 420, gate turn-off resistor 422, gate turn-off resistor 424, and IGBT 402, which may be examples of driver circuitry 106, gate turn-on resistor 120, gate turn-off resistor 122, gate turn-off resistor 124, and IGBT 102 of FIG. 1, respectively. Driver circuitry 406 may include microcontroller 404, gate driver 408, and enhancement driver 410, which may be examples of controller circuit 104, gate driver 108, and enhancement driver 110 of FIG. 1, respectively. As shown, driver circuitry 406 may include sensing circuitry 440. Driver circuitry 406 may be implemented as a single or multiple IC packages. In this example, enhancement driver 410 outputs a second pull-down signal, also referred to herein as "dv/dt enhancement signal" or simply "pull-down signal", via gate turn-off resistor 424, to a gate of IGBT 402.

The example of FIG. 4A may be used in variable bus voltage systems. In this example, no external delay input is used to microcontroller 404. In this example, sensing circuitry 440 may automatically (e.g., without a delay signal generated by microcontroller 404 or another component outside of driver circuitry 406) generate the dv/dt pull-down signal.

Figure 4B:
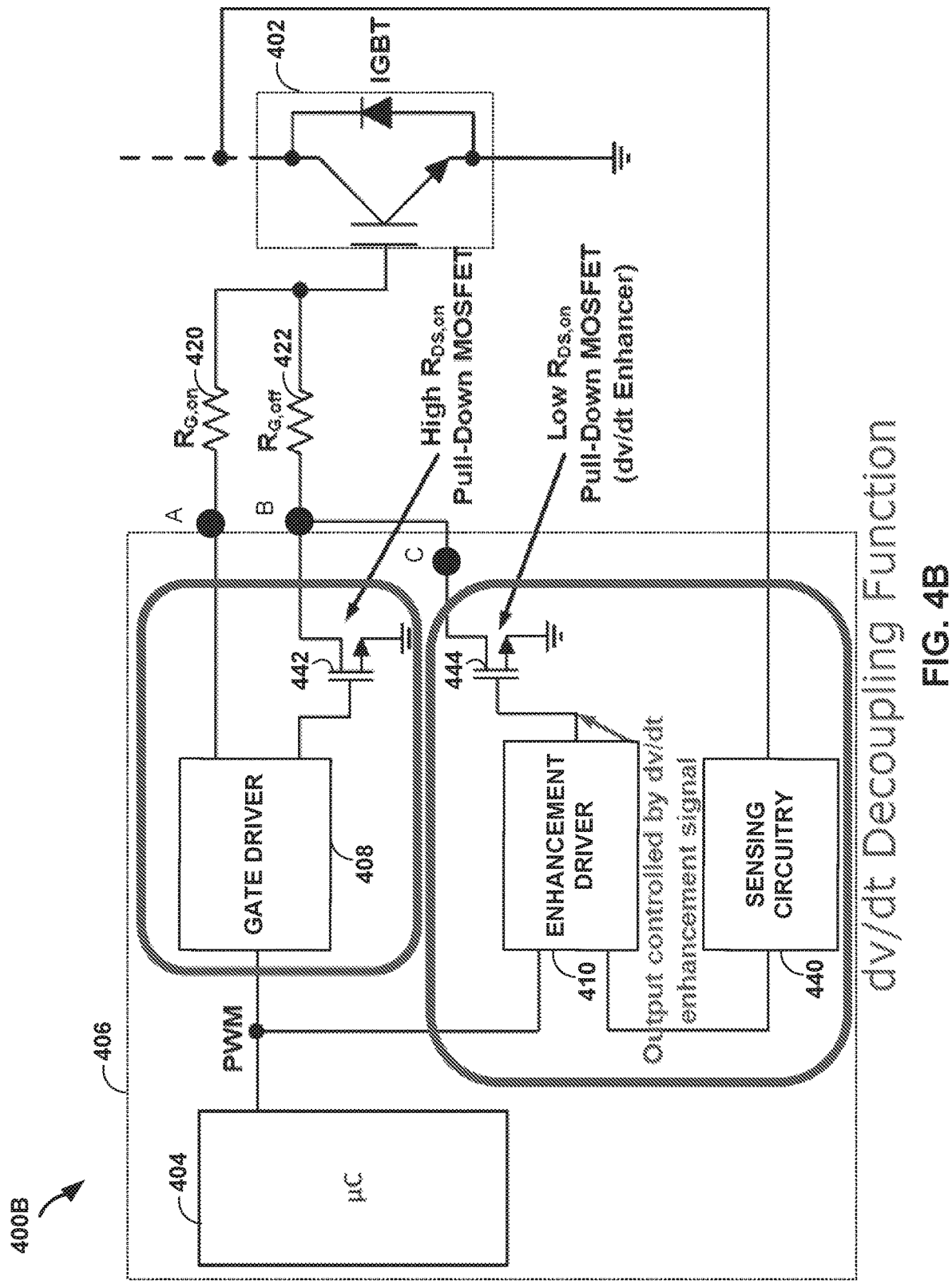
FIG. 4B is a circuit diagram illustrating a second example of the driver circuitry of FIG. 1 with a variable delay determined by a sensing circuit in accordance with one or more techniques of this disclosure.

FIG. 4B is a circuit diagram illustrating a second example of driver circuitry 106 of FIG. 1 with a variable delay determined by sensing circuitry 440 in accordance with one or more techniques of this disclosure. Similar to system 400A, system 400B includes driver circuitry 406, gate turn-on resistor 420, gate turn-off resistor 422, and IGBT 402, which may be examples of driver circuitry 106, gate turn-on resistor 120, gate turn-off resistor 122, and IGBT 102 of FIG. 1, respectively. However, system 400B omits gate turn-off resistor 424. Driver circuitry 406 may include microcontroller 404, gate driver 408, and enhancement driver 410, which may be examples of controller circuit 104, gate driver 108, and enhancement driver 110 of FIG. 1, respectively. Driver circuitry 406 may be implemented as a single or multiple IC packages. In this example, enhancement driver 410 outputs a second pull-down signal, via gate turn-off resistor 422, to a gate of IGBT 402.

FIG. 4B illustrates switching element 442 which may be configured to provide a resistance in series with gate driver 408 and gate turn-off resistor 422. In this example, switching element 444 is configured to provide a resistance in series with enhancement driver 410 and gate turn-off resistor 422. In this example, switching element 444 may be configured to have a different resistance than switching element 442. For instance, switching element 444 may be configured to have a lower or higher resistance than switching element 442. In this way, a gate turn-off signal output by switching element 442 may discharge the gate of IGBT 402 faster or slower than a gate turn-off signal output by switching element 444.

Figure 5A:
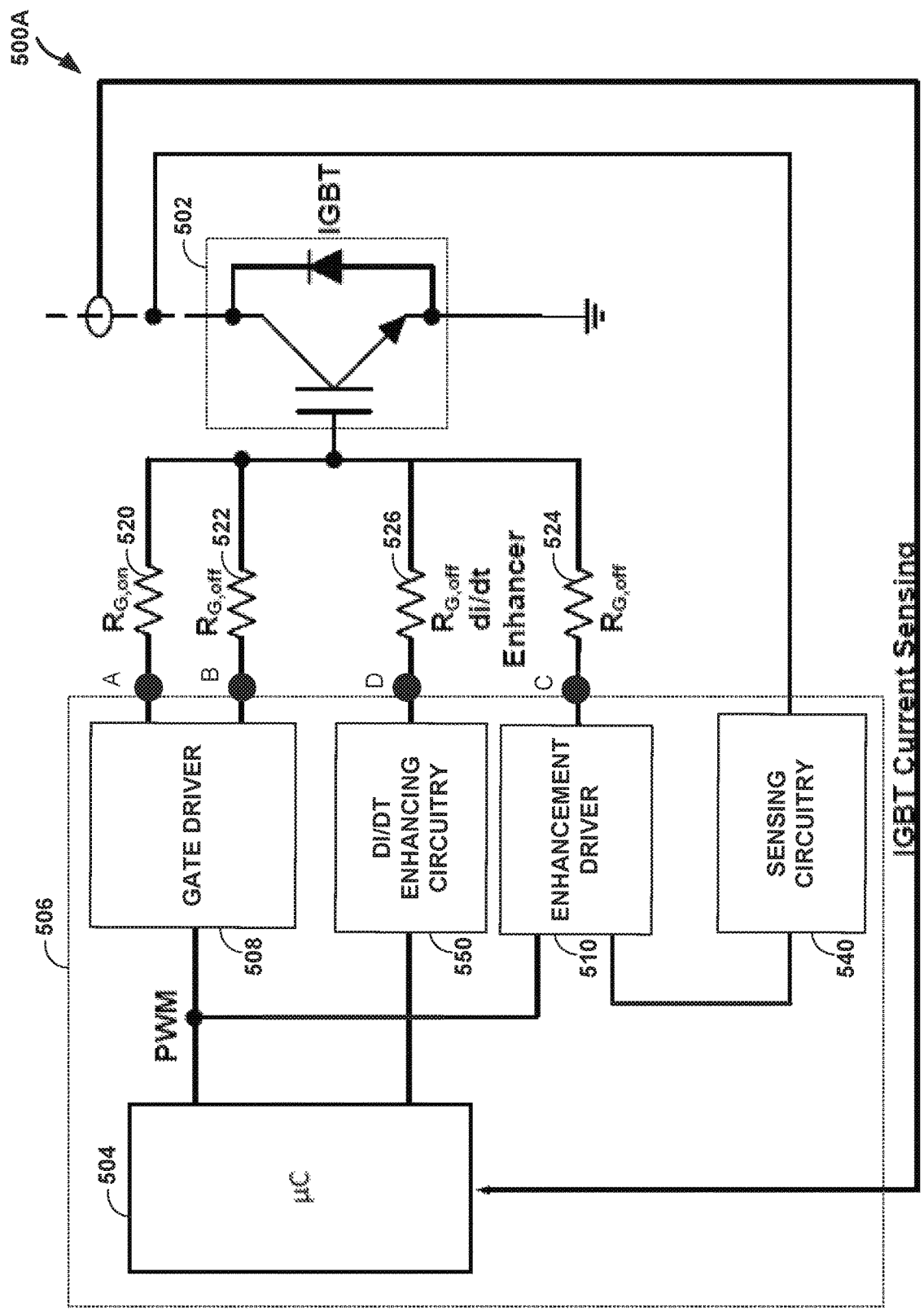
FIG. 5A is a circuit diagram illustrating a first example of the driver circuitry of FIG. 1 with a variable delay determined by a sensing circuit and di/dt enhancing function in accordance with one or more techniques of this disclosure.

FIG. 5A is a circuit diagram illustrating a first example of driver circuitry 106 of FIG. 1 with a variable delay determined by sensing circuit 540 and di/dt enhancing function in accordance with one or more techniques of this disclosure. As shown, system 500A includes driver circuitry 506, gate turn-on resistor 520, gate turn-off resistor 522, gate turn-off resistor 524, and IGBT 502, which may be examples of driver circuitry 106, gate turn-on resistor 120, gate turn-off resistor 122, gate turn-off resistor 124, and IGBT 102 of FIG. 1, respectively. As shown, system 500A may further include gate turn-off resistor 526. Driver circuitry 506 may include microcontroller 504, gate driver 508, and enhancement driver 510, which may be examples of controller circuit 104, gate driver 108, and enhancement driver 110 of FIG. 1, respectively. As shown, driver circuitry 506 may further include sensing circuitry 540 and di/dt enhancing circuitry 550. Driver circuitry 506 may be implemented as a single or multiple IC packages.

Enhancement driver 510 may be configured to output a second pull-down signal, also referred to herein as "dv/dt enhancement signal", or simply "pull-down signal" via gate turn-off resistor 524, to a gate of IGBT 502. As shown, di/dt enhancing circuitry 550 may be configured to output a pull-down signal, also referred to herein as "partial load pull-down signal." via gate turn-off resistor 526, to a gate of IGBT 502. In some examples, di/dt enhancing circuitry 550 may be configured to provide the partial load pull-down signal, via the gate turn-off resistor 526, when microcontroller 504 determines current at IGBT 502 satisfies a load current (e.g., is less than a load current threshold).

Figure 5B:
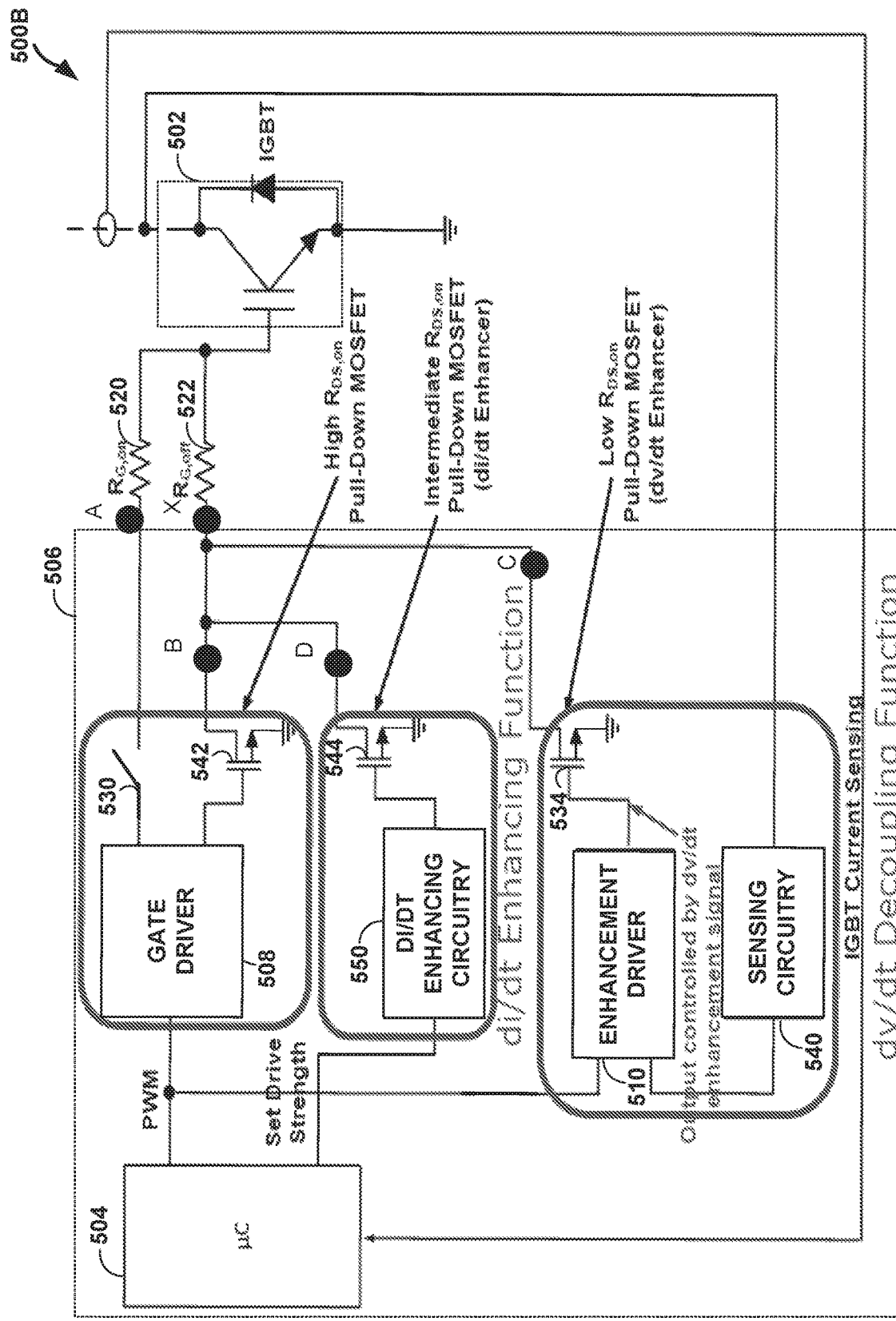
FIG. 5B is a circuit diagram illustrating a second example of the driver circuitry of FIG. 1 with a variable delay determined by a sensing circuit and di/dt enhancing function in accordance with one or more techniques of this disclosure.

FIG. 5B is a circuit diagram illustrating a second example of driver circuitry 106 of FIG. 1 with a variable delay determined by a sensing circuit and current enhancing function in accordance with one or more techniques of this disclosure. Similar to system 500A, system 500B includes driver circuitry 506, gate turn-on resistor 520, gate turn-off resistor 522, and IGBT 502, which may be examples of driver circuitry 106, gate turn-on resistor 120, gate turn-off resistor 122, and IGBT 102 of FIG. 1, respectively. As shown, switching element 530 may be configured to permit current to flow, via gate turn-on resistor 520, to a gate of IGBT 502.

However, system 500B omits gate turn-off resistor 524 and gate turn-off resistor 526. In this example, enhancement driver 510 outputs a second pull-down signal, via gate turn-off resistor 522, to a gate of IGBT 502. In some examples, di/dt enhancing circuitry 550 outputs a partial load pull-down signal, via gate turn-off resistor 522, to a gate of IGBT 502.

In the example of FIG. 5B, switching element 542 may be configured to provide a resistance in series with gate driver 508 and gate turn-off resistor 522. In this example, switching element 544 is configured to provide a resistance in series with enhancement driver 510 and gate turn-off resistor 522. In this example, switching element 544 may be configured to have a different resistance than switching element 542. For instance, switching element 544 may be configured to have a lower or higher resistance than switching element 542. In this way, microcontroller 504 may select, without using an extra pin or extra external resistor, either node B or Node D as Node X, which is coupled, via gate turn-off resistor 522, to a gate of IGBT 502.

The examples of FIGS. 5A and 5B may be used in variable bus voltage systems. In these examples, the reduction in turn off di/dt at IGBT 502 as current reduces may be counteracted by an additional gate resistor which will speed up turn off di/dt at IGBT 502 while maintaining peak overshoot voltage under IGBT voltage breakdown limits. Microcontroller 504 may be configured to set a drive strength based on a system's load current.

Figure 6:
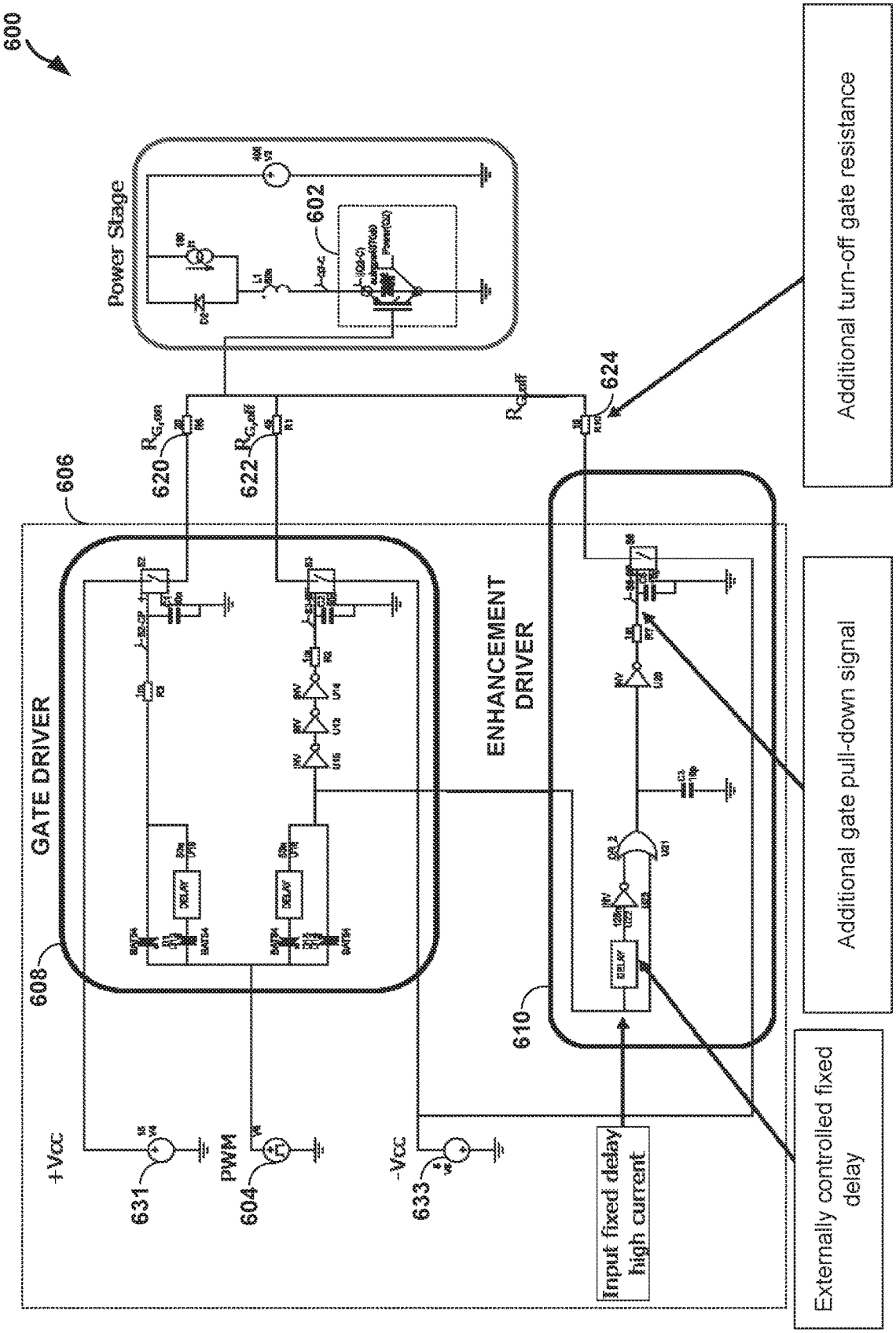
FIG. 6 is a detailed circuit diagram illustrating an example of the driver circuitry of FIG. 1 with a fixed delay in accordance with one or more techniques of this disclosure.

FIG. 6 is a detailed circuit diagram illustrating an example of driver circuitry 106 of FIG. 1 with a fixed delay in accordance with one or more techniques of this disclosure. As shown, system 600 includes driver circuitry 606, gate turn-on resistor 620, gate turn-off resistor 622, gate turn-off resistor 624, and IGBT 602, which may be examples of driver circuitry 106, gate turn-on resistor 120, gate turn-off resistor 122, gate turn-off resistor 124, and IGBT 102 of FIG. 1, respectively. Driver circuitry 606 may include supply 631, supply 633, gate driver 608, and enhancement driver 610, which may be examples of supply 131, supply 133, gate driver 108, and enhancement driver 110 of FIG. 1, respectively. As shown, driver circuitry 606 may further include pulse width modulator (PWM) 604. Driver circuitry 606 may be implemented as a single or multiple IC packages. In this example, enhancement driver 610 outputs a second pull-down signal, also referred to herein as "dv/dt enhancement signal", via gate turn-off resistor 624, to a gate of IGBT 602. As shown, supply 631 outputs a positive voltage to turn on IGBT 602. In this example, supply 633 outputs a negative voltage to turn off IGBT 602. In the examples of FIG. 6, the fixed input delay may be supplied (e.g., by a microcontroller) based on switching characterization of IGBT 602 at the maximum load current and bus voltage specific to an application for IGBT 602.

Figure 7:
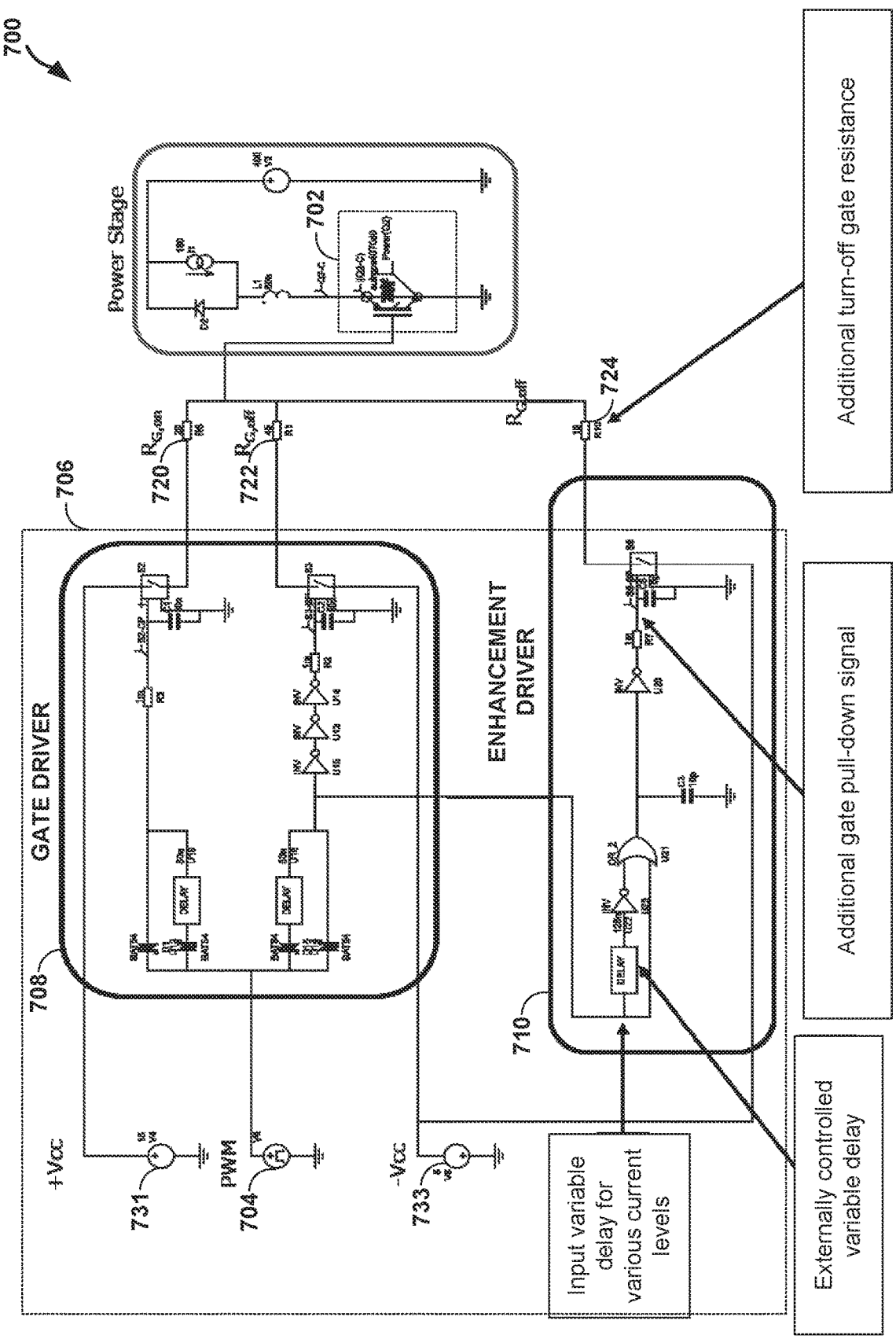
FIG. 7 is a detailed circuit diagram illustrating an example of the driver circuitry of FIG. 1 with an external variable delay in accordance with one or more techniques of this disclosure.

FIG. 7 is a detailed circuit diagram illustrating an example of driver circuitry 106 of FIG. 1 with an external variable delay in accordance with one or more techniques of this disclosure. As shown, system 700 includes driver circuitry 706, gate turn-on resistor 720, gate turn-off resistor 722, gate turn-off resistor 724, and IGBT 702, which may be examples of driver circuitry 106, gate turn-on resistor 120, gate turn-off resistor 122, gate turn-off resistor 124, and IGBT 102 of FIG. 1, respectively. Driver circuitry 706 may include supply 731, supply 733, gate driver 708, and enhancement driver 710, which may be examples of supply 131, supply 133, gate driver 108, and enhancement driver 110 of FIG. 1, respectively. Driver circuitry 706 further includes PWM 704. Driver circuitry 706 may be implemented as a single or multiple IC packages. In the example of FIG. 7, a microcontroller may be configured to calculate a variable delay to reduce losses at IGBT 702.

Figure 8:
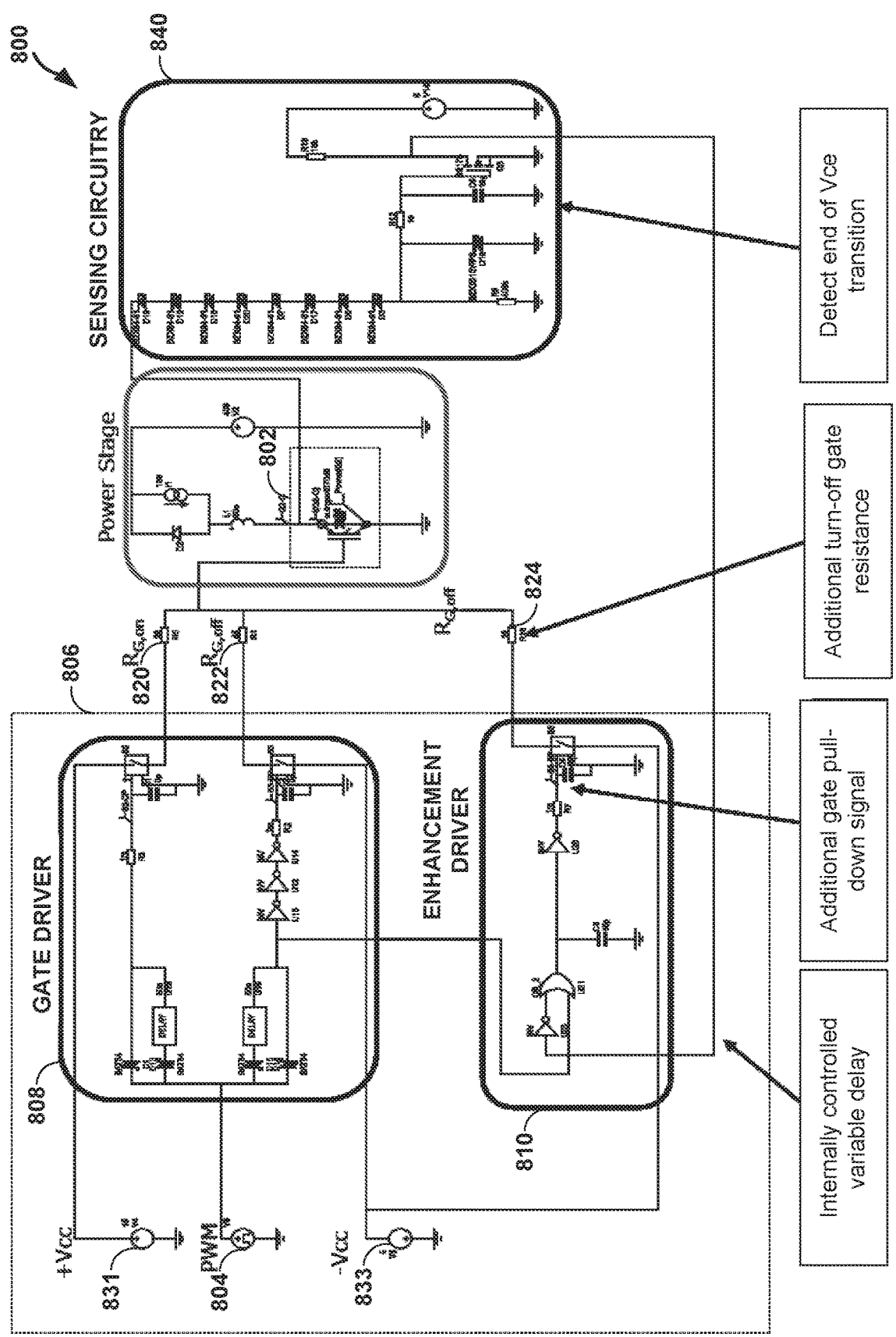
FIG. 8 is a detailed circuit diagram illustrating an example of the driver circuitry of FIG. 1 with an internal variable delay in accordance with one or more techniques of this disclosure.

FIG. 8 is a detailed circuit diagram illustrating an example of the driver circuitry of FIG. 1 with an internal variable delay in accordance with one or more techniques of this disclosure. As shown, system 800 includes driver circuitry 806, gate turn-on resistor 820, gate turn-off resistor 822, gate turn-off resistor 824, and IGBT 802, which may be examples of driver circuitry 106, gate turn-on resistor 120, gate turn-off resistor 122, gate turn-off resistor 124, and IGBT 102 of FIG. 1, respectively. Driver circuitry 806 may include supply 831, supply 833, gate driver 808, and enhancement driver 810, which may be examples of supply 131, supply 133, gate driver 108, and enhancement driver 110 of FIG. 1, respectively. Driver circuitry 806 further includes PWM 804. Driver circuitry 806 may be implemented as a single or multiple IC packages. In the example of FIG. 8, sensing circuitry 840, which may be an example of sensing circuitry 440 of FIG. 4, may be configured to calculate a variable delay to reduce losses at IGBT 802.

Figure 9:
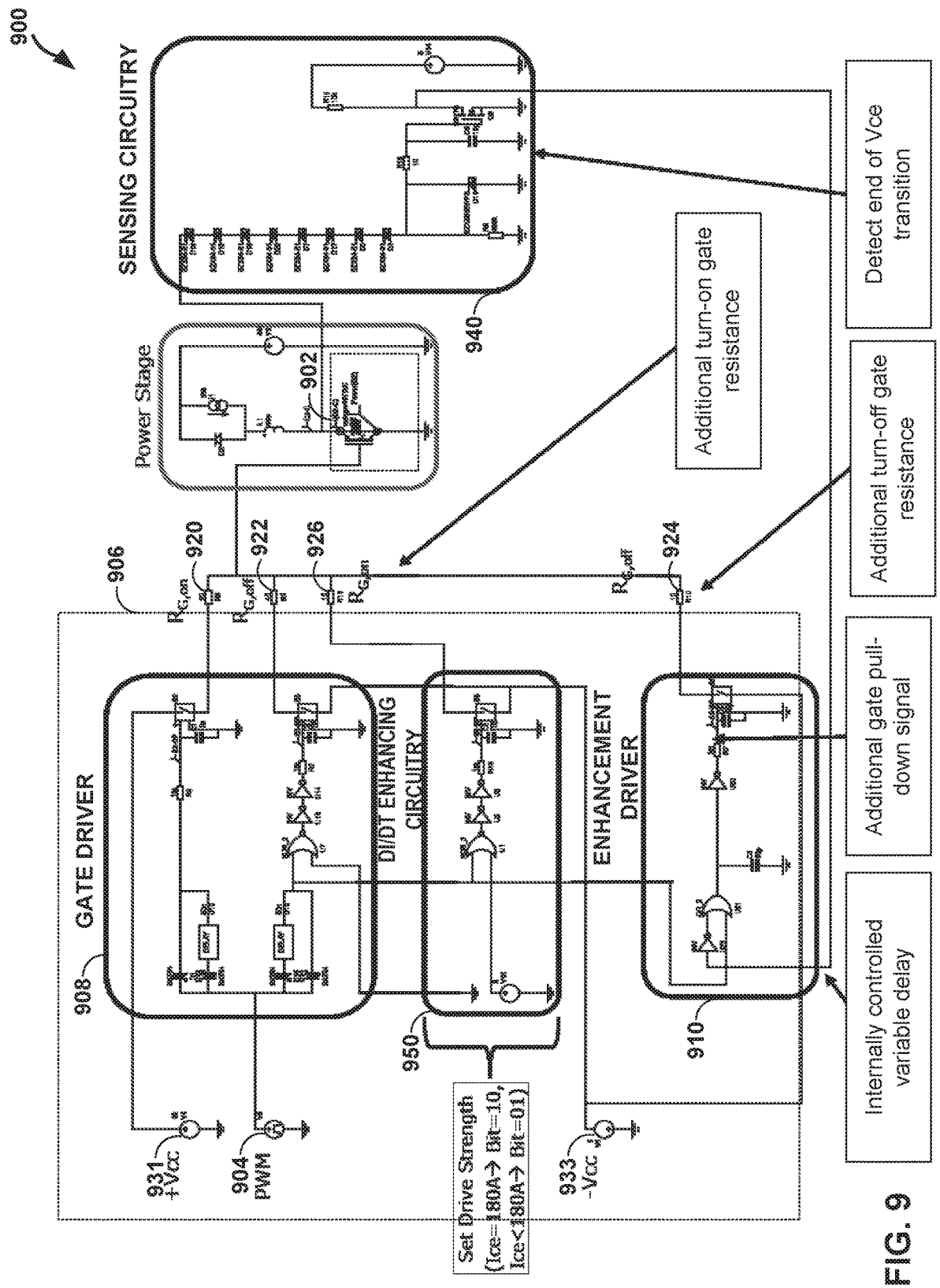
FIG. 9 is a detailed circuit diagram illustrating an example of the driver circuitry of FIG. 1 with an internal variable delay and di/dt enhancing function in accordance with one or more techniques of this disclosure.

FIG. 9 is a detailed circuit diagram illustrating an example of the driver circuitry of FIG. 1 with an internal variable delay and di/dt enhancing function in accordance with one or more techniques of this disclosure. As shown, system 900 includes driver circuitry 906, gate turn-on resistor 920, gate turn-off resistor 922, gate turn-off resistor 924, and IGBT 902, which may be examples of driver circuitry 106, gate turn-on resistor 120, gate turn-off resistor 122, gate turn-off resistor 124, and IGBT 102 of FIG. 1, respectively. Driver circuitry 906 may include supply 931, supply 933, gate driver 908, and enhancement driver 910, which may be examples of supply 131, supply 133, gate driver 108, and enhancement driver 110 of FIG. 1, respectively. Driver circuitry 906 further includes PWM 904. Driver circuitry 906 may be implemented as a single or multiple IC packages. In the example of FIG. 9, sensing circuitry 940, which may be an example of sensing circuitry 440 of FIG. 4, may be configured to calculate a variable delay to reduce losses at IGBT 902.

As shown, system 900 may further include gate turn-off resistor 926 and driver circuitry may further include di/dt enhancing circuitry 950. In this example, di/dt enhancing circuitry 950 may be configured to output a pull-down signal, also referred to herein as "di/dt enhancement signal", via gate turn-off resistor 926, to a gate of IGBT 902. For example, controller circuit 104 may be configured to set the driver strength high when current at IGBT 902 is not less than a load current threshold (e.g., not less than 180 Amps) such that gate driver 908 provides a pull-down signal, via the gate turn-off resistor 920. In this example, controller circuit 104 may be configured to set the driver strength low when current at IGBT 902 is less than a load current threshold (e.g., less than 180 Amps) such that di/dt enhancing circuitry 950 provides a partial load pull-down signal, via the gate turn-off resistor 926.

Figure 10:
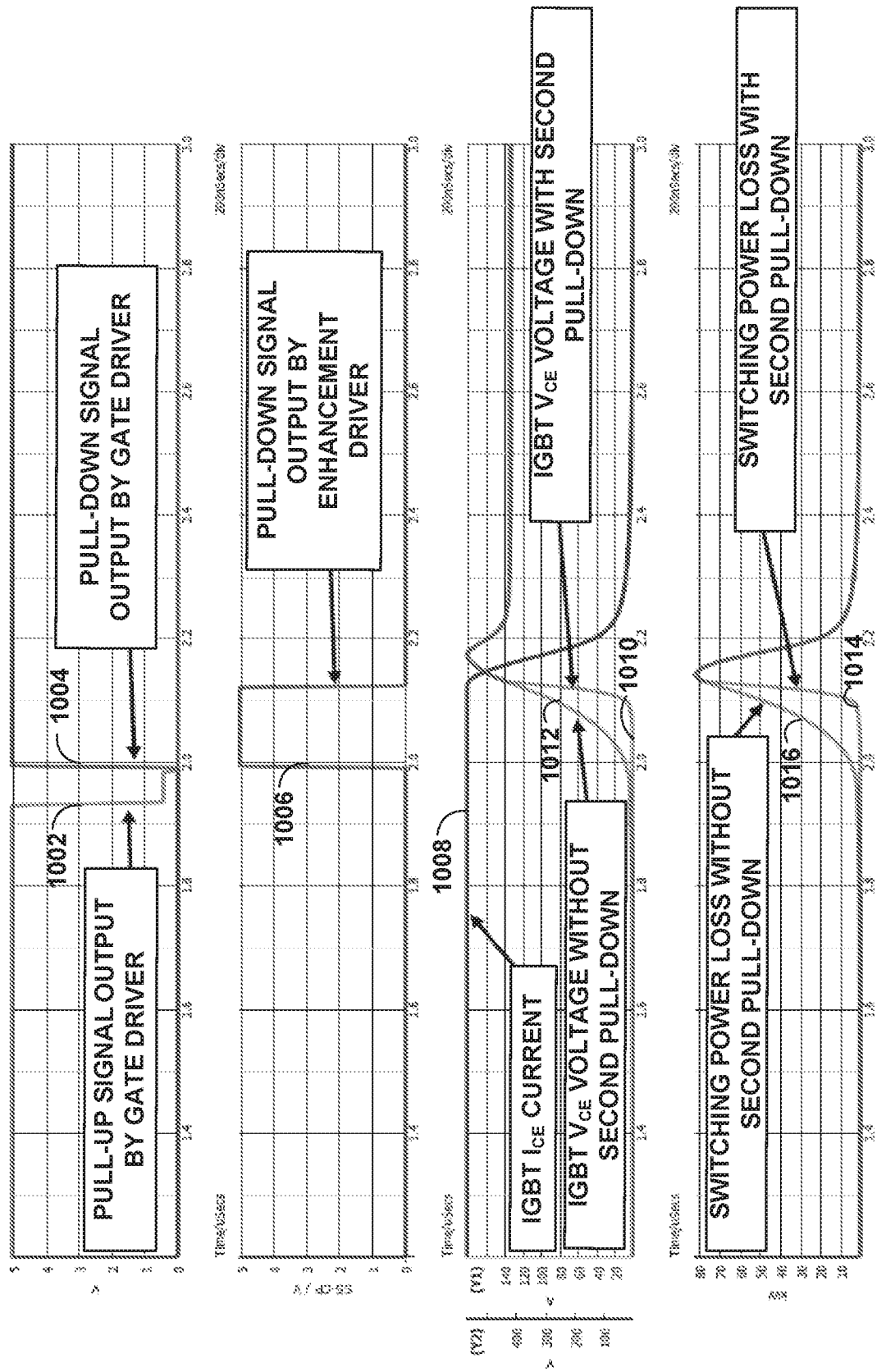
FIG. 10 is a first illustration of a performance of the driver circuitry of FIG. 1 in accordance with one or more techniques of this disclosure.

FIG. 10 is a first illustration of a performance of driver circuitry 106 of FIG. 1 in accordance with one or more techniques of this disclosure. The abscissa axis (e.g., horizontal) of FIG. 10 represents time and the ordinate axis (e.g., vertical) of FIG. 10 represents pull-up signal 1002 output by gate driver 108, via gate turn-on resistor 120, to a gate of IGBT 102, first pull-down signal 1004 output by gate driver 108, via gate turn-off resistor 122, to the gate of IGBT 102, second pull-down signal 1006 output by enhancement driver 110, via gate turn-off resistor 124, to the gate of IGBT 102, IGBT current 1008 at IGBT 102, voltage 1010 at IGBT 102, reference voltage 1012 for a voltage at an IGBT driven without second pull-down signal 1006, power loss 1014 at IGBT 102, and reference power loss 1016 for a voltage at an IGBT driven without second pull-down signal 1006.

In the example of FIG. 10, 400 Volts and 180 Amps are applied to IGBT 102 for a peak turn off overshoot voltage of ~560 Volts. As shown, in the 400 Volts and 180 Amps application, turn off switching losses for driver circuitry 106 may be reduced by 30% compared to systems that omit enhancement driver 110.

Figure 11:
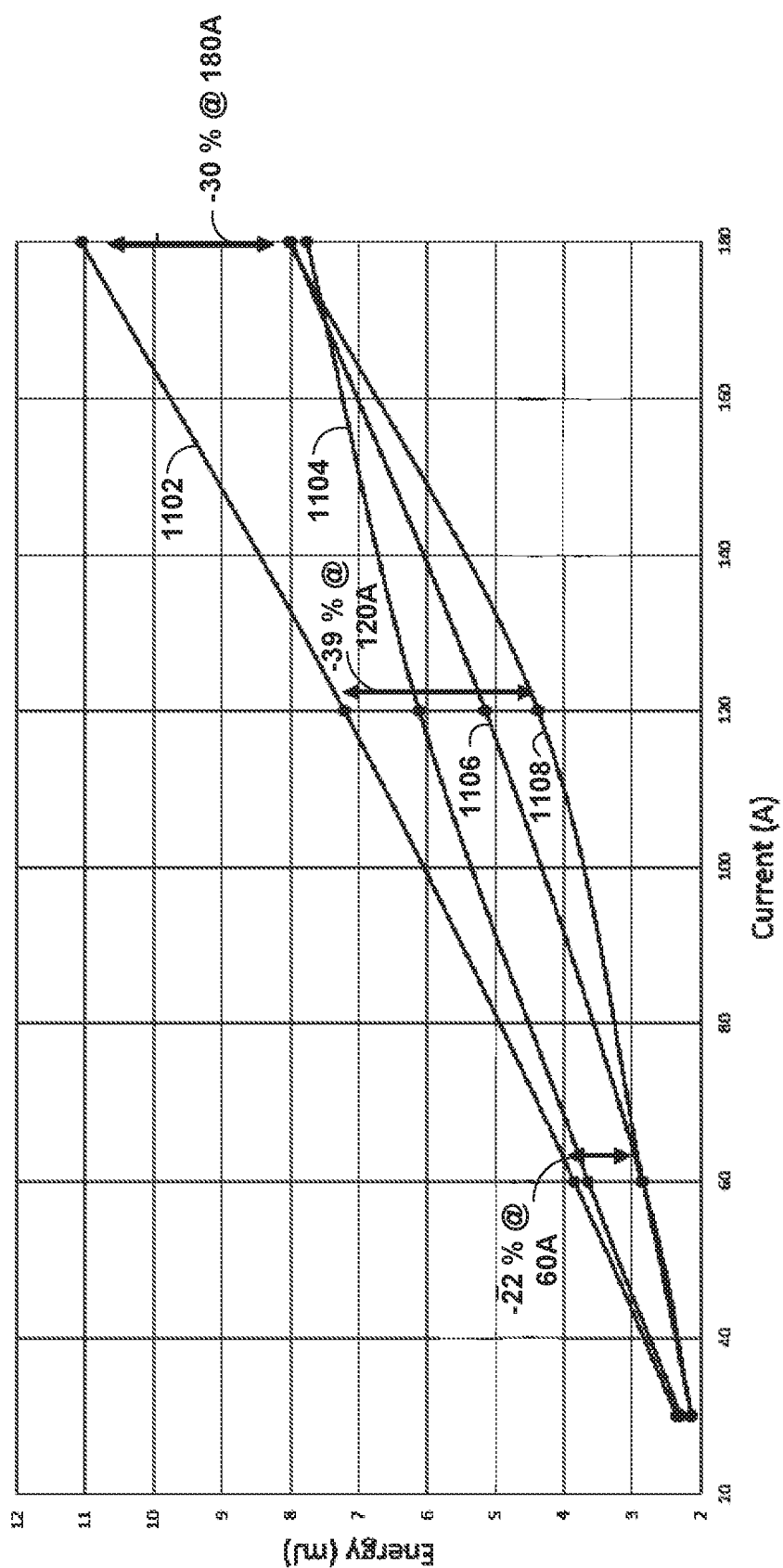
FIG. 11 is a second illustration of a performance of the driver circuitry of FIG. 1 in accordance with one or more techniques of this disclosure.

FIG. 11 is a second illustration of a performance of driver circuitry 106 of FIG. 1 in accordance with one or more techniques of this disclosure. The abscissa axis (e.g., horizontal) of FIG. 11 represents current at IGBT 102 and the ordinate axis (e.g., vertical) of FIG. 11 represents "turn off" switching loss energy 1102 (or simply "energy 1102") for systems that omit enhancement driver 110, energy 1104 for system 100 configured with a fixed delay, energy 1106 for system 100 configured with a variable delay calculated using sensing circuitry (e.g., sensing circuitry 440), energy 1108 for system 100 configured with a variable delay calculated using sensing circuitry (e.g., sensing circuitry 540) and with di/dt enhancing circuitry 550.

Figure 12:
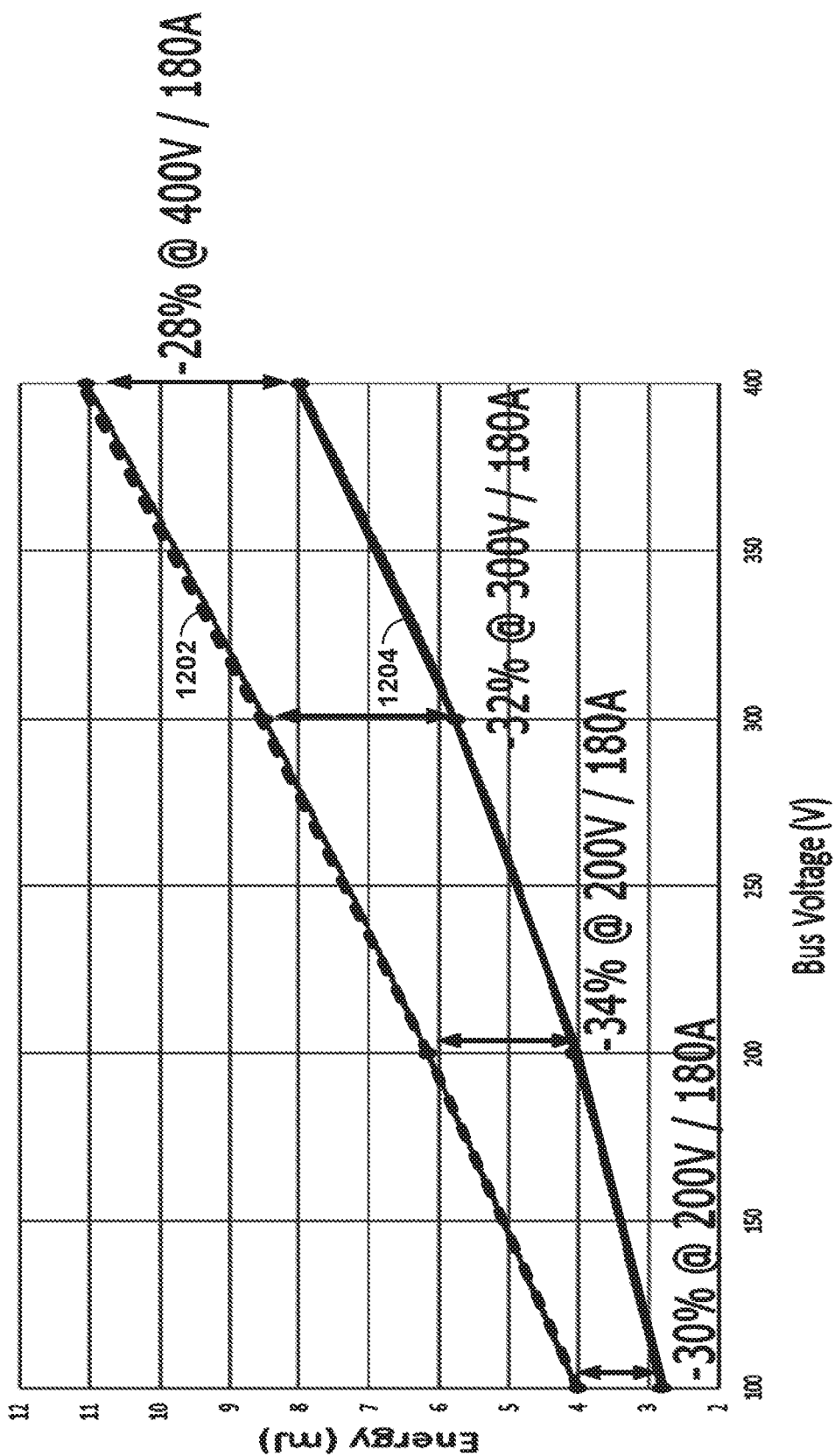
FIG. 12 is a third illustration of a performance of the driver circuitry of FIG. 1 in accordance with one or more techniques of this disclosure.

FIG. 12 is a third illustration of a performance of the driver circuitry of FIG. 1 in accordance with one or more techniques of this disclosure. The abscissa axis (e.g., horizontal) of FIG. 12 represents bus voltage at IGBT 102 at 180 Amps and the ordinate axis (e.g., vertical) of FIG. 12 represents "turn off" switching loss energy 1202 (or simply "energy 1202") for systems that omit enhancement driver 110 and energy 1204 for system 100 configured with a variable delay calculated using sensing circuitry (e.g., sensing circuitry 440).

Figure 13:
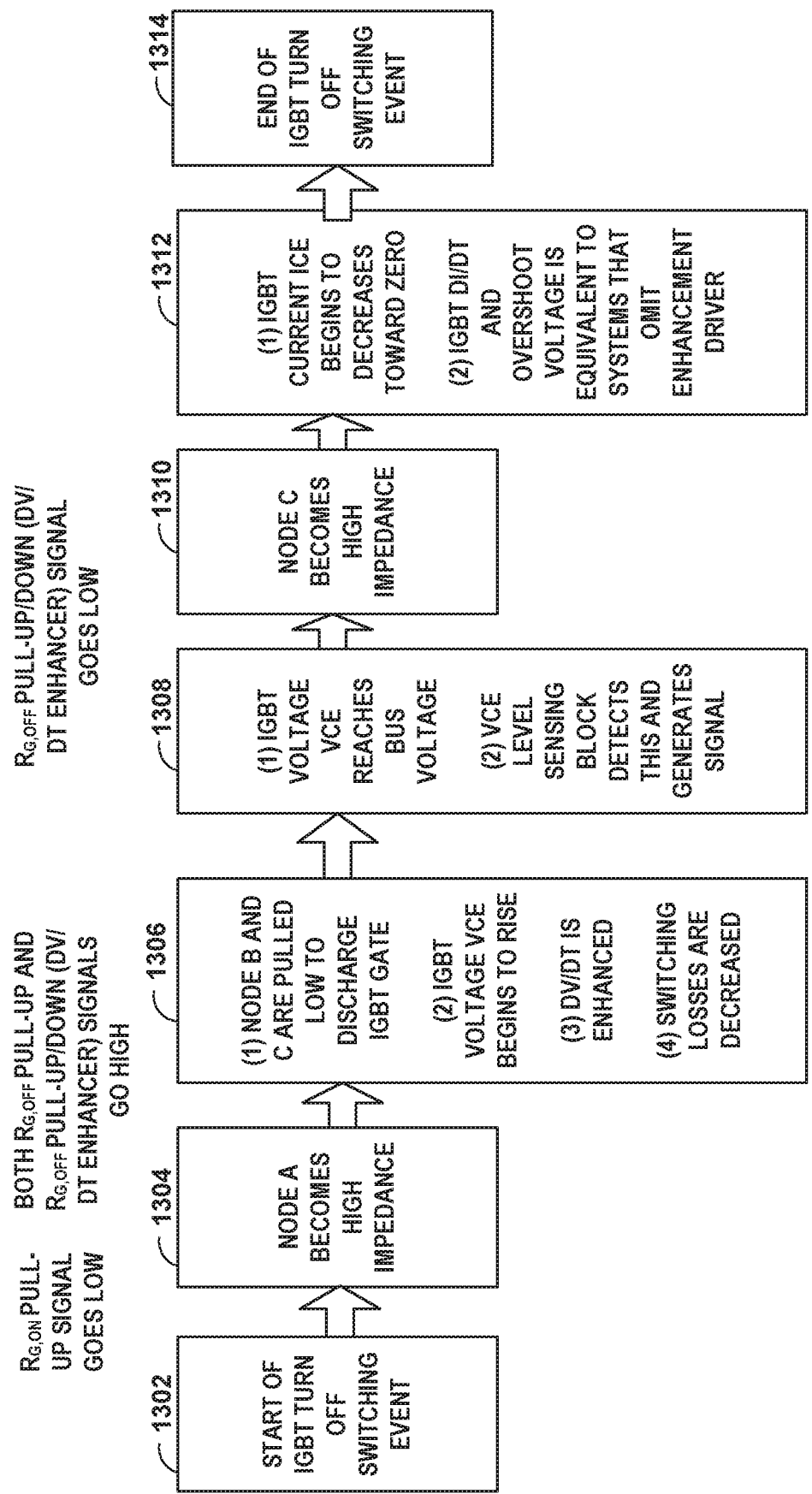
FIG. 13 is a flow diagram for a process for driving an IGBT in accordance with one or more techniques of this disclosure.

FIG. 13 is a flow diagram for a process for driving an IGBT in accordance with one or more techniques of this disclosure. FIG. 13 is described in the context of FIGS. 1-9 for exemplary purposes only. In operation, controller circuit 104 starts an IGBT turn off switching event (1302) and the $R_{g,on}$ pull-up signal goes low. Gate driver 108 sets node A to high impedance (1304) and both the $R_{g,off}$ pull-down signal and $R_{g,off}$ pull-up/down signals are high. For example, gate driver 108 opens switching element 130 and closes switching element 132 and 134. Gate driver 108 pulls node B low to discharge IGBT 102 and enhancement driver 110 pulls node C low to discharge IGBT 102, collector-to-emitter voltage at IGBT 102 begins to rise, a rate of change of voltage (dv/dt) is enhanced, which reduces switching losses at IGBT 102 (1306). The collector-to-emitter voltage at IGBT 102 reaches bus voltage, and a sensing circuit (e.g., sensing circuitry 440) generates a signal (1308), which causes the $R_{g,off}$ pull-up/down signal to go low. Node C becomes high impedance (1310). For example, enhancement driver 110 opens switching element 134. Collector-to-emitter current at IGBT 102 begins to decrease toward zero and a rate of change of the collector-to-emitter current at IGBT 102 and overshoot voltage are equivalent to systems that omit enhancement driver 110 (1312). The IGBT turn off switching event ends (1314).

Figure 14:
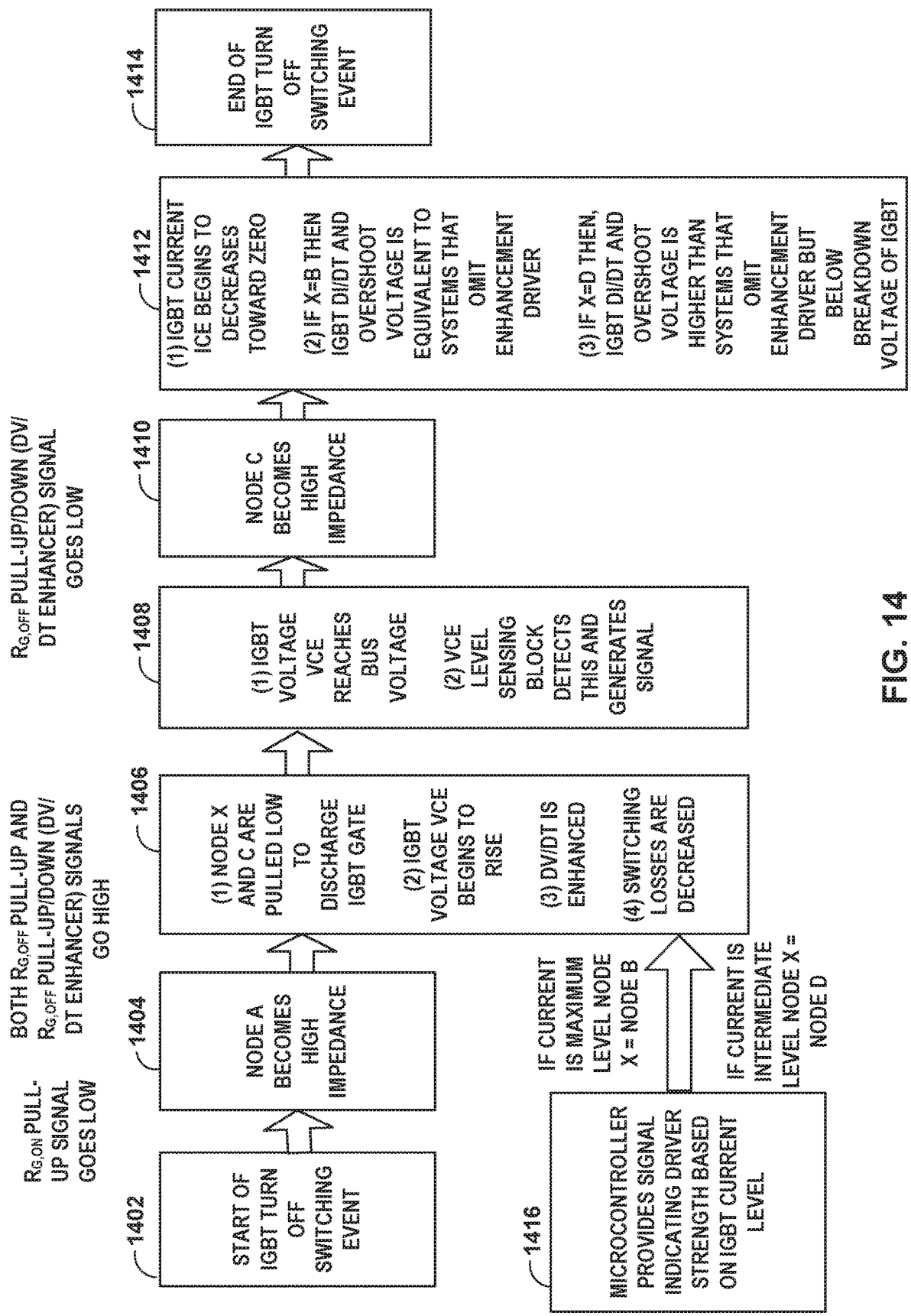
FIG. 14 is a flow diagram for a process for driving an IGBT with a current enhancing function in accordance with one or more techniques of this disclosure.

FIG. 14 is a flow diagram for a process for driving IGBT 102 with a did/dt enhancing function in accordance with one or more techniques of this disclosure. FIG. 14 is described in the context of FIGS. 1-9 for exemplary purposes only. In operation, controller circuit 104 starts an IGBT turn off switching event (1402) and the $R_{g,on}$ pull-up signal goes low. Gate driver 108 sets node A to high impedance (1404) and both the $R_{g,off}$ pull-down signal and $R_{g,off\ dv/dt}$ pull-down signal are high. For example, gate driver 108 opens switching element 130 and closes switching element 132 and switching element 134. While the $R_{g,off\ dv/dt}$ pull-down signal is referred to herein as a "pull-down signal," the $R_{g,off\ dv/dt}$ pull-down signal may change, for instance, from a pull-down signal to a pull-up signal.

Controller circuit 104 provides a signal indicating driver strength based on a current level at IGBT 102 (1416). Said differently, for example, controller circuit 104 is configured to switch in switching element 132 to permit a full load pull-down signal to flow to a gate of IGBT 102 in response to determining current at IGBT 102 satisfies the load current. For instance, if current at IGBT 102 is at a maximum level the signal specifies to set node X to node B.

In response, however, to determining current at IGBT 102 does not satisfy the load current (e.g., the load current is less than the load current threshold), a controller circuit (e.g., microcontroller 504) is configured to switch in a switching element (e.g., switching element 544 of FIG. 5B) to permit a partial load pull-down signal to flow to a gate of IGBT 502. For example, if the current is not at the maximum level the signal specifies to set node X to node D. di/dt enhancing circuitry 550 pulls node D low to discharge IGBT 502 and enhancement driver 510 pulls node C low to discharge IGBT 502, collector-to-emitter voltage at IGBT 502 begins to rise, a rate of change of voltage (dv/dt) is enhanced, which reduces switching losses at IGBT 502 (1406).

For example, in response to the signal specifying to set node X to node B, gate driver 508 pulls node B low to discharge IGBT 502 and di/dt enhancing circuitry 550 refrains from pulling node D low to discharge IGBT 502. In this example, in response to the signal specifying to set node X to node D, gate driver 508 refrains from pulling node B low to discharge IGBT 502 and di/dt enhancing circuitry 550 pulls node D low to discharge IGBT 502.

The collector-to-emitter voltage at IGBT 502 reaches bus voltage, and a sensing circuit (e.g., sensing circuitry 440) generates a signal (1408), which causes the $R_{g,off}$ pull-up/down signal to go low. Node C becomes high impedance (1410). For example, enhancement driver 510 opens switching element 534. Collector-to-emitter current at IGBT 502 begins to decrease toward zero and a rate of change of the collector-to-emitter current at IGBT 502 and overshoot voltage are equivalent to systems that omit enhancement driver 510 (1412). The IGBT turn off switching event ends (1414).

Figure 15:
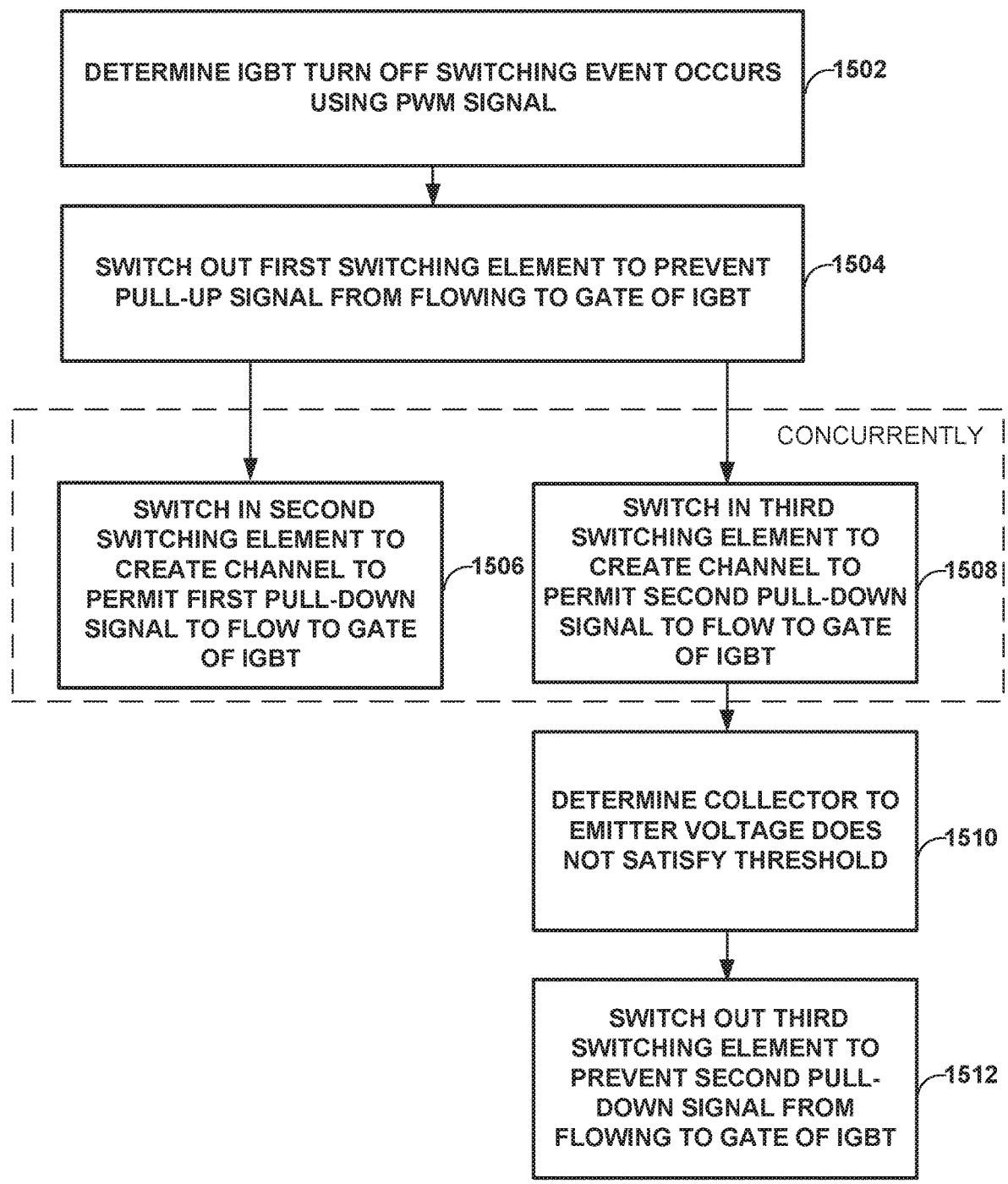
FIG. 15 is a flow diagram for a process for driving an IGBT in accordance with one or more techniques of this disclosure.

FIG. 15 is a flow diagram for a process for driving IGBT 102 in accordance with one or more techniques of this disclosure. FIG. 15 is described in the context of FIGS. 1-9 for exemplary purposes only. In operation, gate driver 108 and enhancement driver 110 determine an IGBT turn off switching event occurs using a PWM signal (1502). Gate driver 108 switches out a first switching element (e.g., switching element 130) to prevent a pull-up signal from flowing to a gate of IGBT 102 (1504). Gate driver 108 switches in a second switching element (e.g., switching element 132) to create a channel to permit a first pull-down signal to flow to a gate of IGBT 102 (1506). Concurrently with gate driver switching in the second switching element, enhancement driver 110 switches in a third switching element (e.g., switching element 134) to create a channel to permit a second pull-down signal to flow to a gate of IGBT 102 (1508).

Controller circuit 104 determines a collector-to-emitter voltage at IGBT 102 does not satisfy a threshold (1510), and switches out the third switching element (e.g., switching element 134) to prevent the second pull-down signal from flowing to the gate of IGBT 102 (1512). For example, controller circuit 104 determines the collector to emitter voltage at IGBT 102 does not satisfy the threshold in response to switching element 134 being switched in for a duration that exceeds a delay threshold. In some examples, the delay is a fixed delay for IGBT 102. In some examples, controller circuit 104 is configured to determine the delay threshold using a sensed voltage at IGBT 102 and a sensed current at IGBT 102. In some examples, controller circuit 104 is configured to determine the collector to emitter voltage at IGBT 102 does not satisfy the threshold in response to the collector to emitter voltage at IGBT 102 being greater than a voltage threshold.

While a device has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

The following examples may illustrate one or more aspects of the disclosure.

Example 1

A controller circuit for controlling an insulated-gate bipolar transistor (IGBT), the controller circuit being configured to: switch out a first switching element to prevent a pull-up signal from flowing to a gate of the IGBT in response to an IGBT turn off switching event; switch in a second switching element to create a channel to permit a first pull-down signal to flow to the gate of the IGBT in response to the IGBT turn off switching event; switch in a third switching element to create a channel to permit a second pull-down signal to flow to the gate of the IGBT in response to the IGBT turn off switching event; and in response to determining a collector to emitter voltage at the IGBT does not satisfy a threshold, switch out the third switching element to prevent the second pull-down signal from flowing to the gate of the IGBT.

Example 2

The controller circuit of example 1, wherein the controller circuit is configured to: determine the collector to emitter voltage at the IGBT does not satisfy the threshold in response to the third switching element being switched in for a duration that exceeds a delay threshold.

Example 3

The controller circuit of any combination of examples 1-2, wherein the delay threshold is a fixed delay for the IGBT.

Example 4

The controller circuit of any combination of examples 1-3, wherein the controller circuit is configured to: determine the delay threshold using a sensed voltage at the IGBT and a sensed current at the IGBT.

Example 5

The controller circuit of any combination of examples 1-4, wherein the controller circuit is configured to: determine the collector to emitter voltage at the IGBT does not satisfy the threshold in response to the collector to emitter voltage at the IGBT being greater than a voltage threshold.

Example 6

The controller circuit of any combination of examples 1-5, wherein the controller circuit is configured to switch in the second switching element in response to determining current at the IGBT satisfies a load current and wherein the controller circuit is configured to: in response to determining current at the IGBT satisfies the load current, refrain from switching in a fourth switching element such that a third pull-down signal is prevented from flowing to the gate of the IGBT.

Example 7

The controller circuit of any combination of examples 1-6, wherein the first pull-down signal is a partial load pull-down signal; wherein the controller circuit is configured to determine current at the IGBT satisfies the load current threshold in response to determining current at the IGBT is less than the load current threshold; and wherein the third pull-down signal is a full load pull-down signal.

Example 8

The controller circuit of any combination of examples 1-7, wherein the first pull-down signal is a full load pull-down signal; wherein the controller circuit is configured to determine current at the IGBT satisfies the load current threshold in response to determining current at the IGBT is not less than the load current threshold; and wherein the third pull-down signal is a partial load pull-down signal.

Example 9

The controller circuit of any combination of examples 1-8, wherein, to switch out the first switching element, the controller circuit is configured to prevent the pull-up signal from flowing to a gate turn-on resistor coupled to the gate of the IGBT; and wherein, to switch in the second switching element, the controller circuit is configured to create the channel such that the first pull-down signal flows through a gate turn-off resistor to the gate of the IGBT.

Example 10

The controller circuit of any combination of examples 1-9, wherein the gate turn-off resistor is a first gate turn-off resistor and wherein, to switch in the third switching element, the controller circuit is configured to create the channel such that the second pull-down signal flows through a second gate turn-off resistor to the gate of the IGBT.

Example 11

The controller circuit of any combination of examples 1-10, wherein, to switch in the third switching element, the controller circuit is configured to create the channel such that the second pull-down signal flows through the gate turn-off resistor to the gate of the IGBT.

Example 12

The controller circuit of any combination of examples 1-11, wherein the controller circuit is configured to: receive a pulse width modulation (PWM) signal; and determine the IGBT turn off switching event using the PWM signal.

Example 13

The controller circuit of any combination of examples 1-12, wherein, to switch in the second switching element, the control circuit is configured to switch in the second switching element such that the channel created by the second switching element permits a first pull-down current to flow from the gate of the IGBT to the pull-down source; and wherein, to switch in the third switching element, the control circuit is configured to switch in the third switching element such that the channel created by the third switching element permits a second pull-down current to flow from the gate of the IGBT to the pull-down source.

Example 14

The controller circuit of any combination of examples 1-13, wherein, to switch in the third switching element, the controller circuit is configured simultaneously switch in the third switching element with the second switching element.

Example 15

A method controlling an insulated-gate bipolar transistor (IGBT), the method comprising: switching out, by a controller circuit, a first switching element to prevent a pull-up signal from flowing to a gate of the IGBT in response to an IGBT turn off switching event; switching in, by the controller circuit, a second switching element to create a channel to permit a first pull-down signal to flow to the gate of the IGBT in response to the IGBT turn off switching event; switching in, by the controller circuit, a third switching element to create a channel to permit a second pull-down signal to flow to the gate of the IGBT in response to the IGBT turn off switching event; and in response to determining a collector to emitter voltage at the IGBT does not satisfy a threshold, switching out, by the controller circuit, the third switching element to prevent the second pull-down signal from flowing to the gate of the IGBT.

Example 16

The method of example 15, further comprising: determining, by the controller circuit, the collector to emitter voltage at the IGBT does not satisfy the threshold in response to the third switching element being switched in for a duration that exceeds a delay threshold.

Example 17

The method of any combination of examples 15-16, wherein the delay threshold is a fixed delay for the IGBT.

Example 18

The method of any combination of examples 15-17, further comprising: determining, by the controller circuit, the delay threshold using a sensed voltage at the IGBT and a sensed current at the IGBT.

Example 19

The method of any combination of examples 15-18, further comprising: determining, by the controller circuit, the collector to emitter voltage at the IGBT does not satisfy the threshold in response to the collector to emitter voltage at the IGBT being greater than a voltage threshold.

Example 20

An insulated-gate bipolar transistor (IGBT) system comprising: an IGBT; and a controller circuit configured to: switch out a first switching element to prevent a pull-up signal from flowing to a gate of the IGBT in response to an IGBT turn off switching event; switch in a second switching element to create a channel to permit a first pull-down signal to flow to the gate of the IGBT in response to the IGBT turn off switching event; switch in a third switching element to create a channel to permit a second pull-down signal to flow to the gate of the IGBT in response to the IGBT turn off switching event; and in response to determining a collector to emitter voltage at the IGBT does not satisfy a threshold, switch out the third switching element to prevent the second pull-down signal from flowing to the gate of the IGBT.

Various aspects have been described in this disclosure. These and other aspects are within the scope of the following claims.

The invention claimed is:

1. A controller circuit for controlling an insulated-gate bipolar transistor (IGBT), the controller circuit being configured to:
  switch out a first switching element to prevent a pull-up signal from flowing to a gate of the IGBT in response to an IGBT turn off switching event;
  switch in a second switching element to create a first channel to permit a first pull-down signal to flow to the gate of the IGBT in response to the IGBT turn off switching event;
  switch in a third switching element to create a second channel to permit a second pull-down signal to flow to the gate of the IGBT in response to the IGBT turn off switching event;
  determine a delay threshold;
  determine a collector to emitter voltage at the IGBT does not satisfy a threshold in response to the third switching element being switched in for a duration that exceeds the delay threshold; and
  in response to determining the collector to emitter voltage at the IGBT does not satisfy the threshold, switch out the third switching element to prevent the second pull-down signal from flowing to the gate of the IGBT.

2. The controller circuit of claim 1, wherein the delay threshold is a fixed delay for the IGBT.

3. The controller circuit of claim 1, wherein, to determine the delay threshold, the controller circuit is configured to:
  determine the delay threshold using a sensed voltage at the IGBT and a sensed current at the IGBT.

4. The controller circuit of claim 1, wherein the controller circuit is configured to switch in the second switching element in response to determining current at the IGBT satisfies a load current threshold and wherein the controller circuit is configured to:
  in response to determining current at the IGBT satisfies the load current threshold, refrain from switching in a fourth switching element such that a third pull-down signal is prevented from flowing to the gate of the IGBT.

5. The controller circuit of claim 4,
  wherein the controller circuit is configured to determine current at the IGBT satisfies the load current threshold in response to determining current at the IGBT is less than the load current threshold.

6. The controller circuit of claim 4,
  wherein the controller circuit is configured to determine current at the IGBT satisfies the load current threshold in response to determining current at the IGBT is not less than the load current threshold.

7. The controller circuit of claim 1,
  wherein, to switch out the first switching element, the controller circuit is configured to prevent the pull-up signal from flowing to a gate turn-on resistor coupled to the gate of the IGBT; and
  wherein, to switch in the second switching element, the controller circuit is configured to create the first channel such that the first pull-down signal flows through a gate turn-off resistor to the gate of the IGBT.

8. The controller circuit of claim 7, wherein the gate turn-off resistor is a first gate turn-off resistor and wherein, to switch in the third switching element, the controller circuit is configured to create the second channel such that the second pull-down signal flows through a second gate turn-off resistor to the gate of the IGBT.

9. The controller circuit of claim 7, wherein, to switch in the third switching element, the controller circuit is configured to create the second channel such that the second pull-down signal flows through the gate turn-off resistor to the gate of the IGBT.

10. The controller circuit of claim 1, wherein the controller circuit is configured to:
  receive a pulse width modulation (PWM) signal; and
  determine the IGBT turn off switching event using the PWM signal.

11. The controller circuit of claim 1,
  wherein, to switch in the second switching element, the control circuit is configured to switch in the second switching element such that the first channel created by the second switching element permits a first pull-down current to flow from the IGBT to a pull-down source; and
  wherein, to switch in the third switching element, the control circuit is configured to switch in the third switching element such that the second channel created by the third switching element permits a second pull-down current to flow from the gate of the IGBT to the pull-down source.

12. The controller circuit of claim 1, wherein, to switch in the third switching element, the controller circuit is configured to simultaneously switch in the third switching element with the second switching element.

13. A method of controlling an insulated-gate bipolar transistor (IGBT), the method comprising:
  switching out, by a controller circuit, a first switching element to prevent a pull-up signal from flowing to a gate of the IGBT in response to an IGBT turn off switching event;
  switching in, by the controller circuit, a second switching element to create a first channel to permit a first pull-down signal to flow to the gate of the IGBT in response to the IGBT turn off switching event;
  switching in, by the controller circuit, a third switching element to create a second channel to permit a second pull-down signal to flow to the gate of the IGBT in response to the IGBT turn off switching event;
  determining, by the controller circuit, a delay threshold;
  determining, by the controller circuit, a collector to emitter voltage at the IGBT does not satisfy a threshold in response to the third switching element being switched in for a duration that exceeds the delay threshold;

in response to determining the collector to emitter voltage at the IGBT does not satisfy the threshold, switching out, by the controller circuit, the third switching element to prevent the second pull-down signal from flowing to the gate of the IGBT.

14. The method of claim 13, wherein the delay threshold is a fixed delay for the IGBT.

15. The method of claim 13, wherein determining the delay threshold comprises:
determining the delay threshold using a sensed voltage at the IGBT and a sensed current at the IGBT.

16. An insulated-gate bipolar transistor (IGBT) system comprising:
an IGBT; and
a controller circuit configured to:
  switch out a first switching element to prevent a pull-up signal from flowing to a gate of the IGBT in response to an IGBT turn off switching event;
  switch in a second switching element to create a first channel to permit a first pull-down signal to flow to the gate of the IGBT in response to the IGBT turn off switching event;
  switch in a third switching element to create a second channel to permit a second pull-down signal to flow to the gate of the IGBT in response to the IGBT turn off switching event;
  determine a delay threshold;
  determine a collector to emitter voltage at the IGBT does not satisfy a threshold in response to the third switching element being switched in for a duration that exceeds the delay threshold;
  in response to determining the collector to emitter voltage at the IGBT does not satisfy the threshold, switch out the third switching element to prevent the second pull-down signal from flowing to the gate of the IGBT.

\* \* \* \* \*